United States Patent
Kim et al.

(10) Patent No.: US 8,633,888 B2
(45) Date of Patent: Jan. 21, 2014

(54) SHIFT REGISTER

(75) Inventors: Binn Kim, Seoul (KR); Yong-Ho Jang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 869 days.

(21) Appl. No.: 12/647,085

(22) Filed: Dec. 24, 2009

(65) Prior Publication Data

US 2010/0214279 A1 Aug. 26, 2010

(30) Foreign Application Priority Data

Feb. 25, 2009 (KR) ........................ 10-2009-0015644

(51) Int. Cl.
*G09G 3/36* (2006.01)

(52) U.S. Cl.
USPC ................................ 345/100; 377/64; 377/79

(58) Field of Classification Search
None
See application file for complete search history.

(56) References Cited

U.S. PATENT DOCUMENTS

| | | | | |
|---|---|---|---|---|
| 7,636,412 B2 * | 12/2009 | Tobita | ............................ | 377/64 |
| 8,155,261 B2 * | 4/2012 | Hu | .................................. | 377/64 |
| 2004/0189585 A1 | 9/2004 | Moon | | |
| 2008/0219401 A1 * | 9/2008 | Tobita | ............................ | 377/79 |

FOREIGN PATENT DOCUMENTS

| | | |
|---|---|---|
| JP | 2004-295126 A | 10/2004 |
| KR | 10-2008-0001856 | 1/2008 |

\* cited by examiner

*Primary Examiner* — Andrew L Sniezek
(74) *Attorney, Agent, or Firm* — Morgan, Lewis & Bockius LLP

(57) ABSTRACT

A shift register which is capable of minimizing a spike voltage is disclosed. The shift register includes a plurality of stages, each including a plurality of nodes, a scan pulse output unit controlled according to voltages at the nodes for outputting a scan pulse and supplying it to a corresponding gate line through a scan output terminal, a carry pulse output unit controlled according to the voltages at the nodes for outputting a carry pulse and supplying it to an upstream stage and a downstream stage through a carry output terminal, a node controller for controlling voltage states of the nodes in response to a carry pulse from the upstream stage and a carry pulse from the downstream stage, and a discharging unit connected to any one of a plurality of clock transfer lines and the scan output terminal for discharging a spike voltage of the scan output terminal.

11 Claims, 12 Drawing Sheets

SHIFT REGISTER

This application claims the benefit of Korean Patent Application No. 10-2009-0015644 filed on Feb. 25, 2009, which is hereby incorporated by reference as if fully set forth herein.

BACKGROUND OF THE INVENTION

1. Field of the Invention

The present invention relates to a shift register, and more particularly, to a shift register which is capable of preventing degradation in picture quality of a display device resulting from a spike voltage.

2. Discussion of the Related Art

In order to sequentially drive gate lines of a display device, there is a need for a shift register to supply scan pulses to the gate lines in order. The shift register includes a plurality of stages for outputting the scan pulses, respectively. The output terminal of each stage is connected one-to-one to a corresponding one of the gate lines. Each gate line is connected to corresponding pixels of the display device. In detail, each pixel includes a thin film transistor which is turned on in response to a scan pulse from a corresponding one of the gate lines to charge a data voltage from a corresponding one of data lines in a pixel electrode of the corresponding pixel. When data is charged on the corresponding data line, a coupling phenomenon occurs between the data line and the corresponding gate line due to a parasitic capacitor of the thin film transistor. At the moment that the data voltage is applied to the data line, a voltage on the gate line rises together owing to the coupling phenomenon. Although one gate line must be driven only once by one scan pulse for one frame period, a spike voltage induced by this coupling phenomenon is generated on the gate line. As a result, the gate line is driven by the spike voltage even though no scan pulse is applied thereto. Accordingly, for the one frame period, the gate line may be driven more than once and, thus, the thin film transistor may be turned on more than once, thereby causing a wrong data voltage to be supplied to the pixel, resulting in degradation in picture quality. A more serious problem is that a downstream stage may be set or an upstream stage may be reset with undesired timings because this spike voltage may be spread to the downstream stage and upstream stage along this gate line. In this case, a multi-output may be generated from each stage, thereby causing the corresponding gate line to be driven several times as mentioned above. In addition, the lifetime of the shift register may be reduced.

The above problem more frequently occurs particularly in an Electrophoretic Display (EPD) which displays an image by moving black pigment particles and white pigment particles vertically using a field effect. The reason is that the area of a thin film transistor in a pixel in the EPD is much larger than the areas of thin film transistors in pixels in other display devices due to driving characteristics of the EPD. When the thin film transistor becomes larger in area, the parasitic capacitor becomes higher in capacitance and the spike voltage thus becomes higher in level.

FIG. 1 illustrates multi-output generation based on a spike voltage. In FIG. 1, "A" represents the waveform of a (k−2)th scan pulse outputted from a (k−2)th stage and supplied to a (k−2)th gate line, "B" represents the waveform of a kth scan pulse outputted from a kth stage and supplied to a kth gate line, and "C" represents the waveform of a spike voltage generated on the (k−2)th gate line. A multi-output D is generated on the kth gate line by this spike voltage.

SUMMARY OF THE INVENTION

Accordingly, the present invention is directed to a shift register that substantially obviates one or more problems due to limitations and disadvantages of the related art.

An object of the present invention is to provide a shift register which is not influenced by a spike voltage and has a discharging unit capable of rapidly discharging the spike voltage.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register includes a plurality of stages for sequentially driving gate lines to which pixels for display of an image are connected, wherein each of the stages includes a plurality of nodes, a scan pulse output unit controlled according to voltages at the nodes for outputting a scan pulse and supplying the scan pulse to a corresponding one of the gate lines through a scan output terminal, a carry pulse output unit controlled according to the voltages at the nodes for outputting a carry pulse and supplying the carry pulse to an upstream one of the stages and a downstream one of the stages through a carry output terminal, a node controller for controlling voltage states of the nodes in response to a carry pulse from the upstream stage and a carry pulse from the downstream stage, and a discharging unit connected to any one of a plurality of clock transfer lines and the scan output terminal for discharging a spike voltage of the scan output terminal, the clock transfer lines transferring a plurality of clock pulses with different phases, respectively.

The discharging unit may include a discharging switching device turned on or off in response to the spike voltage of the scan output terminal, the discharging switching device interconnecting the scan output terminal and any one of the clock transfer lines when turned on.

The nodes may include a set node and a reset node, and the node controller of a kth one of the stages may include a first switching device turned on or off in response to a carry pulse from a (k−2)th one of the stages, the first switching device interconnecting a charging voltage line and the set node when turned on, the charging voltage line transferring a charging voltage, a second switching device turned on or off in response to a carry pulse from a (k+2)th one of the stages, the second switching device interconnecting a discharging voltage line and the set node when turned on, the discharging voltage line transferring a discharging voltage, a third switching device turned on or off in response to a voltage at the set node, the third switching device interconnecting the reset node and the discharging voltage line when turned on, a fourth switching device turned on or off in response to the carry pulse from the (k−2)th stage, the fourth switching device interconnecting the reset node and the discharging voltage line when turned on, a fifth switching device turned on or off in response to a reset signal, the fifth switching device interconnecting the reset node and the discharging voltage line when turned on, a sixth switching device turned on or off in response to a voltage at the reset node, the sixth switching device interconnecting the set node and the discharging voltage line when turned on, and a seventh switching device turned on or off in response to the charging voltage, the seventh switching device interconnecting the charging voltage line and the reset node when turned on.

The scan pulse output unit of the kth stage may include a scan pull-up switching device turned on or off in response to the voltage at the set node, the scan pull-up switching device interconnecting any one of the clock transfer lines and the scan output terminal when turned on, and a scan pull-down switching device turned on or off in response to the voltage at the reset node, the scan pull-down switching device interconnecting the scan output terminal and the discharging voltage line when turned on, and the carry pulse output unit of the kth stage may include a carry pull-up switching device turned on or off in response to the voltage at the set node, the carry pull-up switching device interconnecting any one of the clock transfer lines and the carry output terminal when turned on, and a carry pull-down switching device turned on or off in response to the voltage at the reset node, the carry pull-down switching device interconnecting the carry output terminal and the discharging voltage line when turned on, wherein the carry output terminal of the kth stage is connected to the node controller of the (k−2)th stage and the node controller of the (k+2)th stage.

Alternatively, the nodes may include a set node, a first reset node, and a second reset node, and the node controller of a kth one of the stages may include a first switching device turned on or off in response to a carry pulse from a (k−2)th one of the stages, the first switching device interconnecting a charging voltage line and the set node when turned on, the charging voltage line transferring a charging voltage, a second switching device turned on or off in response to a carry pulse from a (k+2)th one of the stages, the second switching device interconnecting a discharging voltage line and the set node when turned on, the discharging voltage line transferring a discharging voltage, a third switching device turned on or off in response to a voltage at the first reset node, the third switching device interconnecting the set node and the discharging voltage line when turned on, a fourth switching device turned on or off in response to a voltage at the second reset node, the fourth switching device interconnecting the set node and the discharging voltage line when turned on, a fifth switching device turned on or off in response to a first alternating current (AC) voltage from a first AC voltage line, the fifth switching device interconnecting the first AC voltage line and the first reset node when turned on, a sixth switching device turned on or off in response to a second AC voltage from a second AC voltage line, the sixth switching device interconnecting the second AC voltage line and the second reset node when turned on, a seventh switching device turned on or off in response to the carry pulse from the (k−2)th stage, the seventh switching device interconnecting the first reset node and the discharging voltage line when turned on, an eighth switching device turned on or off in response to a reset signal, the eighth switching device interconnecting the first reset node and the discharging voltage line when turned on, a ninth switching device turned on or off in response to the reset signal, the ninth switching device interconnecting the second reset node and the discharging voltage line when turned on, a tenth switching device turned on or off in response to a voltage at the set node, the tenth switching device interconnecting the first reset node and the discharging voltage line when turned on, an eleventh switching device turned on or off in response to the voltage at the set node, the eleventh switching device interconnecting the second reset node and the discharging voltage line when turned on, and a twelfth switching device turned on or off in response to the carry pulse from the (k−2)th stage, the twelfth switching device interconnecting the second reset node and the discharging voltage line when turned on.

The scan pulse output unit of the kth stage may include a scan pull-up switching device turned on or off in response to the voltage at the set node, the scan pull-up switching device interconnecting any one of the clock transfer lines and the scan output terminal when turned on, a first scan pull-down switching device turned on or off in response to the voltage at the first reset node, the first scan pull-down switching device interconnecting the scan output terminal and the discharging voltage line when turned on, and a second scan pull-down switching device turned on or off in response to the voltage at the second reset node, the second scan pull-down switching device interconnecting the scan output terminal and the discharging voltage line when turned on, and the carry pulse output unit of the kth stage may include a carry pull-up switching device turned on or off in response to the voltage at the set node, the carry pull-up switching device interconnecting any one of the clock transfer lines and the carry output terminal when turned on, a first carry pull-down switching device turned on or off in response to the voltage at the first reset node, the first carry pull-down switching device interconnecting the carry output terminal and the discharging voltage line when turned on, and a second carry pull-down switching device turned on or off in response to the voltage at the second reset node, the second carry pull-down switching device interconnecting the carry output terminal and the discharging voltage line when turned on, wherein the carry output terminal of the kth stage is connected to the node controller of the (k−2)th stage and the node controller of the (k+2)th stage.

As another alternative, the nodes may include a set node, a first reset node, and a second reset node, and the node controller of a kth one of the stages may include a first switching device turned on or off in response to a carry pulse from a (k−2)th one of the stages, the first switching device interconnecting a charging voltage line and the set node when turned on, the charging voltage line transferring a charging voltage, a second switching device turned on or off in response to a carry pulse from a (k+2)th one of the stages, the second switching device interconnecting a discharging voltage line and the set node when turned on, the discharging voltage line transferring a discharging voltage, a third switching device turned on or off in response to a voltage at the first reset node, the third switching device interconnecting the set node and the discharging voltage line when turned on, a fourth switching device turned on or off in response to a voltage at the second reset node, the fourth switching device interconnecting the set node and the discharging voltage line when turned on, a fifth switching device turned on or off in response to a first AC voltage from a first AC voltage line, the fifth switching device interconnecting the first AC voltage line and a first common node when turned on, a sixth switching device turned on or off in response to a voltage at the first common node, the sixth switching device interconnecting the first AC voltage line and the first reset node when turned on, a seventh switching device turned on or off in response to a reset signal, the seventh switching device interconnecting the first common node and the discharging voltage line when turned on, an eighth switching device turned on or off in response to a voltage at the set node, the eighth switching device interconnecting the first common node and the discharging voltage line when turned on, a ninth switching device turned on or off in response to a second AC voltage from a second AC voltage line, the ninth switching device interconnecting the second AC voltage line and a second common node when turned on, a tenth switching device turned on or off in response to a voltage at the second common node, the tenth switching device interconnecting the second AC voltage line and the first reset node when turned on, an eleventh switching device turned on or off in response to the reset signal, the eleventh switching device interconnecting the second common node and the discharging voltage line when turned on, a twelfth switching device turned on or off in response to the voltage at the set node, the twelfth switching device interconnecting the second common node and the discharging voltage line when turned on, a thirteenth switching device turned on or off in response to the carry pulse from the (k−2)th stage, the thirteenth switching device interconnecting the first reset node and the discharging voltage line when turned on, a fourteenth switching device turned on or off in response to the voltage at the set node, the fourteenth switching device interconnecting the first reset node and the discharging voltage line when turned on, a fifteenth switching device turned on or off in response to the voltage at the set node, the fifteenth switching device interconnecting the second reset node and the discharging voltage line when turned on, and a sixteenth switching device turned on or off in response to the carry pulse from the (k−2)th stage, the sixteenth switching device interconnecting the second reset node and the discharging voltage line when turned on.

The scan pulse output unit of the kth stage may include a scan pull-up switching device turned on or off in response to the voltage at the set node, the scan pull-up switching device interconnecting any one of the clock transfer lines and the scan output terminal when turned on, a first scan pull-down switching device turned on or off in response to the voltage at the first reset node, the first scan pull-down switching device interconnecting the scan output terminal and the discharging voltage line when turned on, and a second scan pull-down switching device turned on or off in response to the voltage at the second reset node, the second scan pull-down switching device interconnecting the scan output terminal and the discharging voltage line when turned on, and the carry pulse output unit of the kth stage may include a carry pull-up switching device turned on or off in response to the voltage at the set node, the carry pull-up switching device interconnecting any one of the clock transfer lines and the carry output terminal when turned on, a first carry pull-down switching device turned on or off in response to the voltage at the first reset node, the first carry pull-down switching device interconnecting the carry output terminal and the discharging voltage line when turned on, and a second carry pull-down switching device turned on or off in response to the voltage at the second reset node, the second carry pull-down switching device interconnecting the carry output terminal and the discharging voltage line when turned on, wherein the carry output terminal of the kth stage is connected to the node controller of the (k−2)th stage and the node controller of the (k+2)th stage.

As another alternative, the nodes may include a set node, a first reset node, and a second reset node, and the node controller of a kth one of the stages may include a first switching device turned on or off in response to an external start pulse or a carry pulse from a (k−2)th one of the stages, the first switching device interconnecting a charging voltage line and the set node of the kth stage when turned on, the charging voltage line transferring a charging voltage, a second switching device turned on or off in response to a carry pulse from a (k+3)th one of the stages, the second switching device interconnecting a discharging voltage line and the set node of the kth stage when turned on, the discharging voltage line transferring the discharging voltage, a third switching device turned on or off in response to a voltage at the first reset nodes of the kth stage and a (k+1)th one of the stages which are connected to each other, the third switching device interconnecting the set node of the kth stage and the discharging voltage line when turned on, a fourth switching device turned on or off in response to a voltage at the second reset nodes of the kth stage and (k+1)th stage which are connected to each other, the fourth switching device interconnecting the set node of the kth stage and the discharging voltage line when turned on, a fifth switching device turned on or off in response to a voltage at the set node of the kth stage, the fifth switching device interconnecting the first reset nodes of the kth stage and (k+1)th stage and the discharging voltage line when turned on, a sixth switching device turned on or off in response to the start pulse or the carry pulse from the (k−2)th stage, the sixth switching device interconnecting the first reset nodes of the kth stage and (k+1)th stage and the discharging voltage line when turned on, a seventh switching device turned on or off in response to a first AC voltage from a first AC voltage line, the seventh switching device interconnecting the first AC voltage line and a common node of the kth stage when turned on, an eighth switching device turned on or off in response to a voltage at the common node of the kth stage, the eighth switching device interconnecting the first AC voltage line and the first reset nodes of the kth stage and (k+1)th stage when turned on, a ninth switching device turned on or off in response to the voltage at the set node of the kth stage, the ninth switching device interconnecting the common node of the kth stage and the discharging voltage line when turned on, a tenth switching device turned on or off in response to a voltage at the set node of the (k+1)th stage, the tenth switching device interconnecting the common node of the kth stage and the discharging voltage line when turned on, an eleventh switching device turned on or off in response to a reset signal, the eleventh switching device interconnecting the common node of the kth stage and the discharging voltage line when turned on, and a twelfth switching device turned on or off in response to the start pulse, the twelfth switching device interconnecting the set node of the kth stage and the discharging voltage line when turned on.

The scan pulse output unit of the kth stage may include a scan pull-up switching device turned on or off in response to the voltage at the set node of the kth stage, the scan pull-up switching device interconnecting any one of the clock transfer lines and the scan output terminal when turned on, a first scan pull-down switching device turned on or off in response to the voltage at the first reset node of the kth stage, the first scan pull-down switching device interconnecting the scan output terminal and the discharging voltage line when turned on, and a second scan pull-down switching device turned on or off in response to the voltage at the second reset node of the kth stage, the second scan pull-down switching device interconnecting the scan output terminal and the discharging voltage line when turned on, and the carry pulse output unit of the kth stage may include a carry pull-up switching device turned on or off in response to the voltage at the set node of the kth stage, the carry pull-up switching device interconnecting any one of the clock transfer lines and the carry output terminal when turned on, a first carry pull-down switching device turned on or off in response to the voltage at the first reset node of the kth stage, the first carry pull-down switching device interconnecting the carry output terminal and the discharging voltage line when turned on, and a second carry pull-down switching device turned on or off in response to the voltage at the second reset node of the kth stage, the second carry pull-down switching device interconnecting the carry output terminal and the discharging voltage line when turned on, wherein the carry output terminal of the kth stage is connected to the node controller of the (k−2)th stage and the node controller of the (k+2)th stage.

The node controller of the (k+1)th stage may include a first switching device turned on or off in response to the external start pulse or a carry pulse from a (k−1)th one of the stages, the first switching device interconnecting the charging voltage line and the set node of the (k+1)th stage when turned on, a second switching device turned on or off in response to the carry pulse from the (k+3)th stage, the second switching device interconnecting the set node of the (k+1)th stage and the discharging voltage line when turned on, a third switching device turned on or off in response to the voltage at the first reset nodes of the kth stage and (k+1)th stage which are connected to each other, the third switching device interconnecting the set node of the (k+1)th stage and the discharging voltage line when turned on, a fourth switching device turned on or off in response to the voltage at the second reset nodes of the kth stage and (k+1)th stage which are connected to each other, the fourth switching device interconnecting the set node of the (k+1)th stage and the discharging voltage line when turned on, a fifth switching device turned on or off in response to the voltage at the set node of the (k+1)th stage, the fifth switching device interconnecting the second reset nodes of the kth stage and (k+1)th stage and the discharging voltage line when turned on, a sixth switching device turned on or off in response to the start pulse or the carry pulse from the (k−2)th stage, the sixth switching device interconnecting the second reset nodes of the kth stage and (k+1)th stage and the discharging voltage line when turned on, a seventh switching device turned on or off in response to a second AC voltage from a second AC voltage line, the seventh switching device interconnecting the second AC voltage line and a common node of the (k+1)th stage when turned on, an eighth switching device turned on or off in response to a voltage at the common node of the (k+1)th stage, the eighth switching device interconnecting the second AC voltage line and the second reset nodes of the kth stage and (k+1)th stage when turned on, a ninth switching device turned on or off in response to the voltage at the set node of the (k+1)th stage, the ninth switching device interconnecting the common node of the (k+1)th stage and the discharging voltage line when turned on, a tenth switching device turned on or off in response to the voltage at the set node of the kth stage, the tenth switching device interconnecting the common node of the (k+1)th stage and the discharging voltage line when turned on, an eleventh switching device turned on or off in response to the reset signal, the eleventh switching device interconnecting the common node of the (k+1)th stage and the discharging voltage line when turned on, and a twelfth switching device turned on or off in response to the start pulse, the twelfth switching device interconnecting the set node of the (k+1)th stage and the discharging voltage line when turned on.

The scan pulse output unit of the (k+1)th stage may include a scan pull-up switching device turned on or off in response to the voltage at the set node of the (k+1)th stage, the scan pull-up switching device interconnecting any one of the clock transfer lines and the scan output terminal when turned on, a first scan pull-down switching device turned on or off in response to the voltage at the first reset node of the (k+1)th stage, the first scan pull-down switching device interconnecting the scan output terminal and the discharging voltage line when turned on, and a second scan pull-down switching device turned on or off in response to the voltage at the second reset node of the (k+1)th stage, the second scan pull-down switching device interconnecting the scan output terminal and the discharging voltage line when turned on, and the carry pulse output unit of the (k+1)th stage may include a carry pull-up switching device turned on or off in response to the voltage at the set node of the (k+1)th stage, the carry pull-up switching device interconnecting any one of the clock transfer lines and the carry output terminal when turned on, a first carry pull-down switching device turned on or off in response to the voltage at the first reset node of the (k+1)th stage, the first carry pull-down switching device interconnecting the carry output terminal and the discharging voltage line when turned on, and a second carry pull-down switching device turned on or off in response to the voltage at the second reset node of the (k+1)th stage, the second carry pull-down switching device interconnecting the carry output terminal and the discharging voltage line when turned on, wherein the carry output terminal of the (k+1)th stage is connected to the node controller of the (k−1)th stage and the node controller of the (k+3)th stage.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
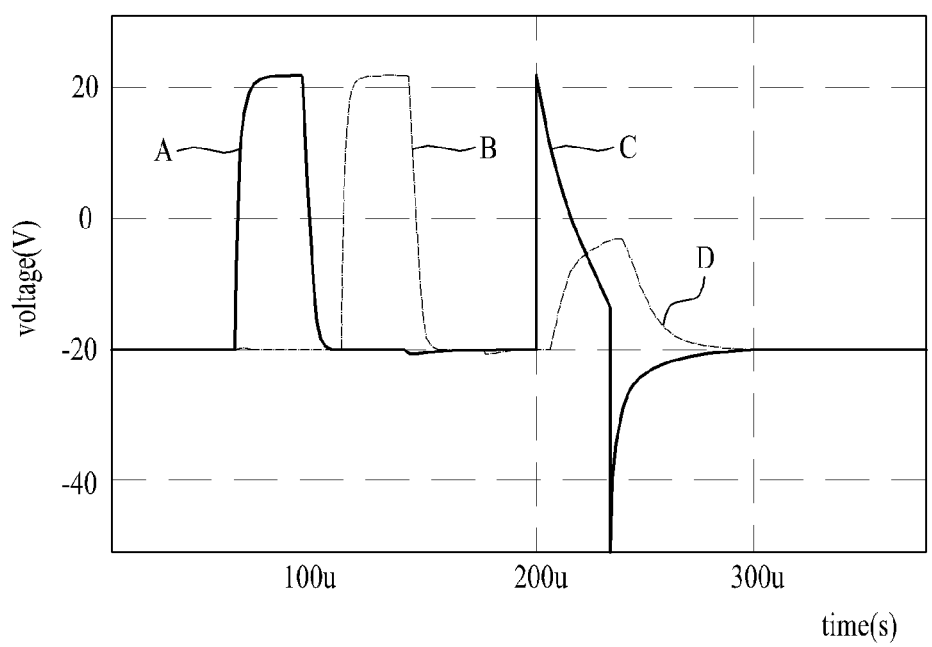
FIG. 1 is a waveform diagram illustrating multi-output generation based on a spike voltage.
Figure 2:
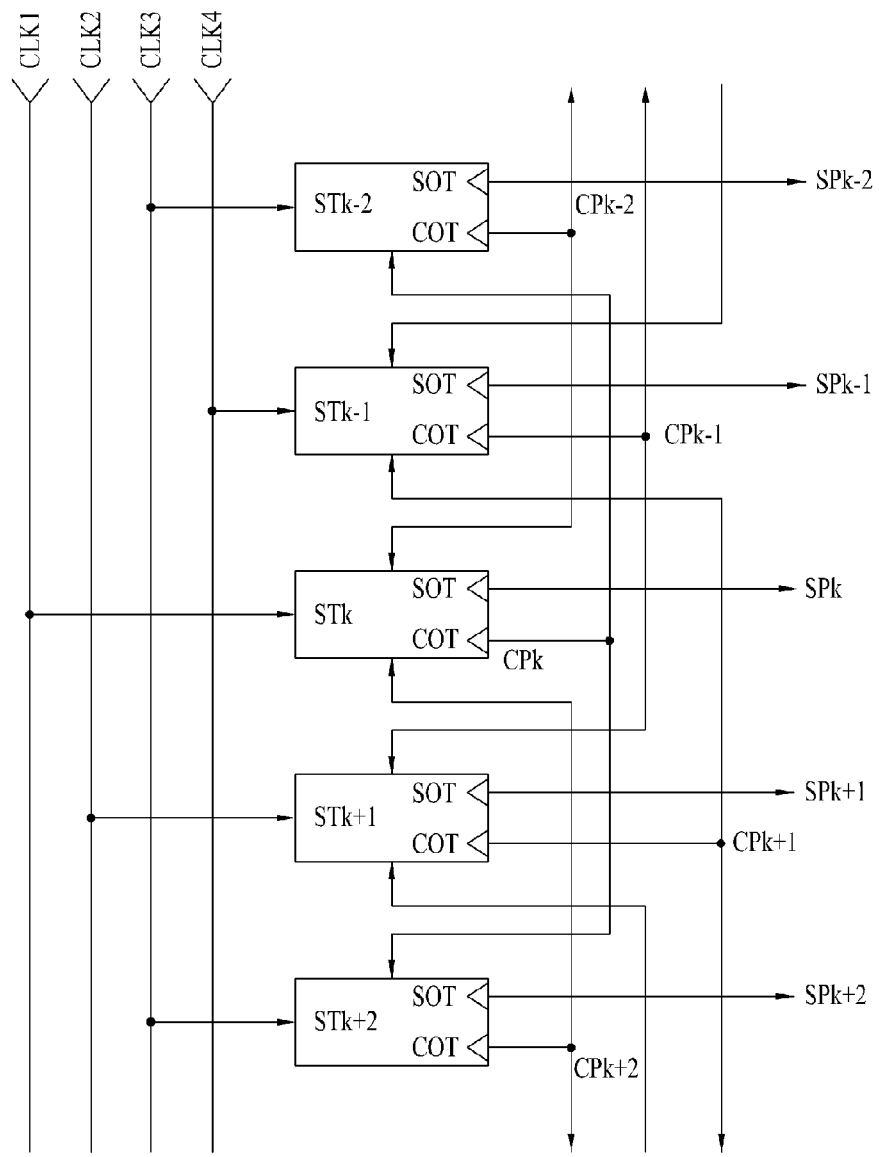
FIG. 2 is a block diagram showing the configuration of a shift register according to an exemplary embodiment of the present invention.

FIG. 2 is a block diagram showing the configuration of a shift register according to an exemplary embodiment of the present invention.

The shift register according to the present embodiment includes a plurality of stages STj, as shown in FIG. 2. Each of the stages STj outputs one scan pulse SPj for one frame period through a scan output terminal SOT thereof and also outputs one carry pulse CPj for the one frame period through a carry output terminal COT thereof. Here, "j" in the reference characters STj, SPj and CPj is a natural number, and may be, for example, k−2, k−1, k, k+1 or k+2 in FIG. 2.

The scan pulse and carry pulse outputted from one stage have the same phase. Each stage drives a gate line connected thereto using the scan pulse and controls the operations of a stage downstream therefrom and a stage upstream therefrom using the carry pulse. In detail, a kth scan pulse SPk from a kth stage STk is supplied to a kth gate line, and a kth carry pulse CPk from the kth stage STk is supplied to a (k−2)th stage STk−2 and a (k+2)th stage STk+2. The (k+2)th stage STk+2 is set by the kth carry pulse CPk, and the (k−2)th stage STk−2 is reset by the kth carry pulse CPk.

The stages output scan pulses and carry pulses in order from a first stage to an nth stage. That is, the first stage outputs a first scan pulse and a first carry pulse, the second stage then outputs a second scan pulse and a second carry pulse, the third stage then outputs a third scan pulse and a third carry pulse, . . . , and the nth stage then outputs an nth scan pulse and an nth carry pulse. Then, a dummy stage, not shown, outputs an (n+1)th carry pulse.

The scan pulses outputted from the stages, other than the dummy stage, are sequentially supplied to gate lines of a display device to sequentially scan the gate lines. The carry pulse outputted from each of the stages is supplied to an upstream stage, supplied to the upstream stage and a downstream stage or supplied to the downstream stage.

This shift register may be built in the display device. That is, the display device has a display region for displaying an image, and a non-display region surrounding the display region, and the shift register is built in the non-display region.

Each stage in this shift register has a configuration as follows.

Figure 3:
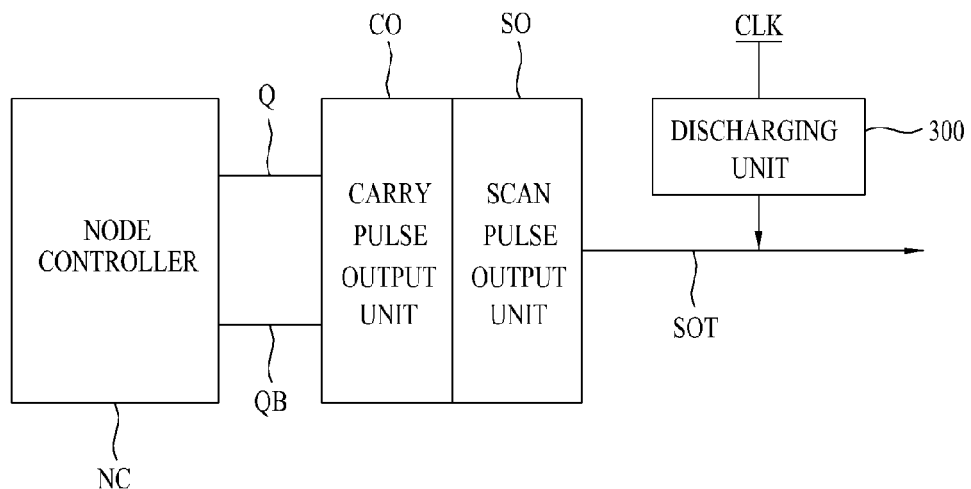
FIG. 3 is a block diagram showing a first embodiment of the configuration of any one of stages of FIG. 2.

FIG. 3 is a block diagram showing a first embodiment of the configuration of any one of the stages of FIG. 2.

Each stage includes, as shown in FIG. 3, a scan pulse output unit SO controlled according to voltages at a set node Q and reset node QB for outputting a scan pulse and supplying it to a corresponding gate line through the scan output terminal SOT, a carry pulse output unit CO controlled according to the voltages at the set node Q and reset node QB for outputting a carry pulse and supplying it to an upstream stage and a downstream stage through the carry output terminal COT, a node controller NC for controlling the voltage states of the set node Q and reset node QB in response to a carry pulse from the upstream stage and a carry pulse from the downstream stage, and a discharging unit 300 connected to any one of a plurality of clock transfer lines which transfer a plurality of clock pulses with different phases, respectively, and the scan output terminal SOT for discharging a spike voltage of the scan output terminal SOT.

The stage of FIG. 3 has a circuit configuration as follows.

Figure 4:
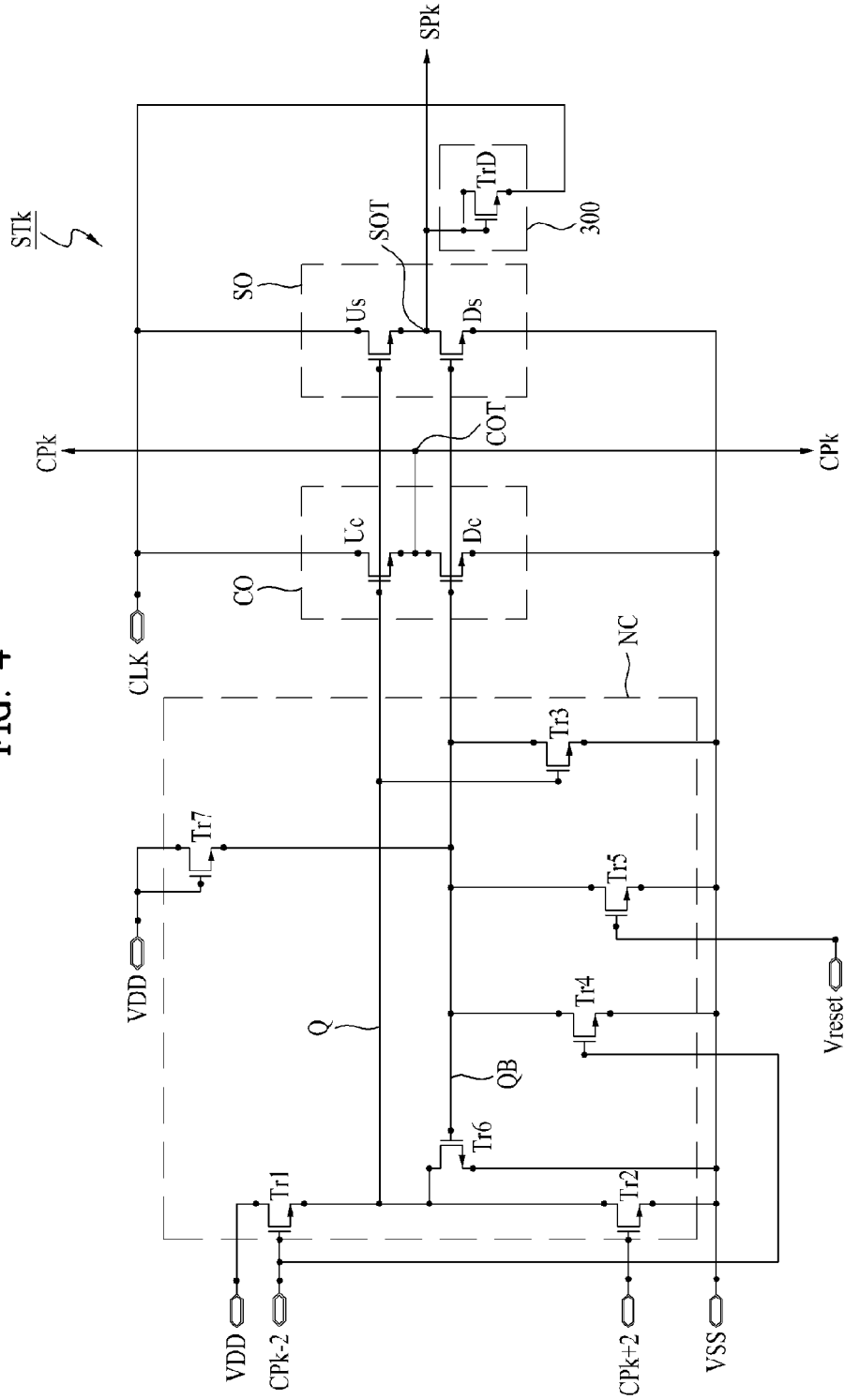
FIG. 4 is a detailed circuit diagram of the circuit configuration of the stage shown in FIG. 3.
Figure 5:
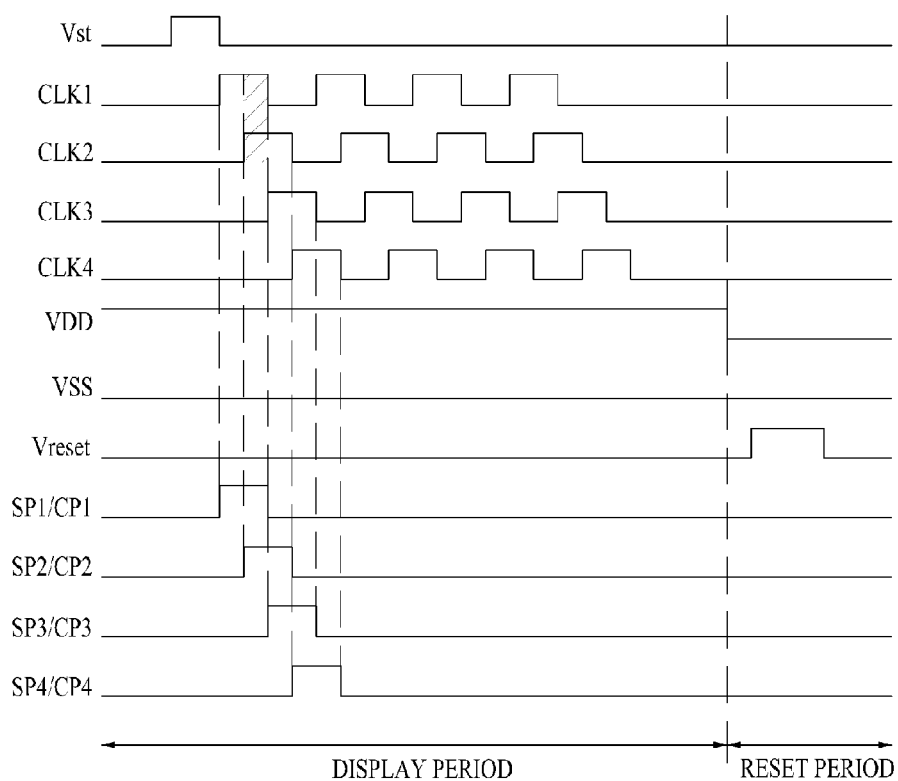
FIG. 5 is a timing diagram of various signals which are supplied to the stage of FIG. 4.

FIG. 4 is a detailed circuit diagram of the circuit configuration of the stage shown in FIG. 3, and FIG. 5 is a timing diagram of various signals which are supplied to the stage of FIG. 4.

Each stage having the configuration as shown in FIG. 3 is supplied with any one of first to fourth clock pulses CLK1 to CLK4 which are outputted sequentially out of phase with one another and cyclically, a charging voltage VDD, and a discharging voltage VSS. On the other hand, the first and second stages among the aforementioned stages are further supplied with a start pulse Vst. This start pulse Vst functions to set the first and second stages. Alternatively, the first stage may be supplied with a first start pulse, and the second stage may be supplied with a second start pulse outputted subsequently to the first start pulse.

Both the charging voltage VDD and discharging voltage VSS are direct current (DC) voltages. The charging voltage VDD is positive and the discharging voltage VSS is negative. On the other hand, the discharging voltage VSS may be a ground voltage. The low state voltage value of each of the clock pulses CLK1 to CLK4 is the same as the voltage value of the discharging voltage VSS.

A detailed description will hereinafter be given of the circuit configuration of each stage supplied with the aforementioned signals.

The node controller NC of the kth stage STk includes first to seventh switching devices Tr1 to Tr7, as shown in FIG. 4.

The first switching device Tr1 is turned on or off in response to a carry pulse CPk−2 from the (k−2)th stage STk−2, and interconnects a charging voltage line which transfers the charging voltage VDD and the set node Q when turned on. Alternatively, the carry pulse CPk−2 from the (k−2)th stage STk−2 may be supplied to the drain electrode (or source electrode) of the first switching device Tr1 of the kth stage STk instead of the charging voltage VDD.

The second switching device Tr2 is turned on or off in response to a carry pulse CPk+2 from the (k+2)th stage STk+2, and interconnects a discharging voltage line which transfers the discharging voltage VSS and the set node Q when turned on.

The third switching device Tr3 is turned on or off in response to the voltage at the set node Q, and interconnects the reset node QB and the discharging voltage line when turned on.

The fourth switching device Tr4 is turned on or off in response to the carry pulse CPk−2 from the (k−2)th stage STk−2, and interconnects the reset node QB and the discharging voltage line when turned on.

The fifth switching device Tr5 is turned on or off in response to a reset signal Vreset, and interconnects the reset node QB and the discharging voltage line when turned on.

The sixth switching device Tr6 is turned on or off in response to the voltage at the reset node QB, and interconnects the set node Q and the discharging voltage line when turned on.

The seventh switching device Tr7 is turned on or off in response to the charging voltage VDD, and interconnects the charging voltage line and the reset node QB when turned on. Alternatively, a clock pulse may be supplied to the gate electrode of the seventh switching device Tr7 of the kth stage STk instead of the charging voltage VDD. In this case, although the clock pulse supplied to the seventh switching device Tr7 of the kth stage STk may be the same as a clock pulse connected to a scan pull-up switching device Us, it is preferable that the supplied clock pulse be different from the connected clock pulse.

The scan pulse output unit SO of the kth stage STk includes the scan pull-up switching device Us and a scan pull-down switching device Ds.

The scan pull-up switching device Us is turned on or off in response to the voltage at the set node Q, and interconnects any one of the clock transfer lines and the scan output terminal SOT when turned on.

The scan pull-down switching device Ds is turned on or off in response to the voltage at the reset node QB, and interconnects the scan output terminal SOT and the discharging voltage line when turned on.

The carry pulse output unit CO of the kth stage STk includes a carry pull-up switching device Uc and a carry pull-down switching device Dc.

The carry pull-up switching device Uc is turned on or off in response to the voltage at the set node Q, and interconnects any one of the clock transfer lines and the carry output terminal COT when turned on.

The carry pull-down switching device Dc is turned on or off in response to the voltage at the reset node QB, and interconnects the carry output terminal COT and the discharging voltage line when turned on.

Here, the carry output terminal COT of the kth stage STk is connected to the node controller NC of the (k−2)th stage STk−2 and the node controller NC of the (k+2)th stage STk+2.

The discharging unit 300 of the kth stage STk includes a discharging switching device TrD which is turned on or off in response to the spike voltage of the scan output terminal SOT, and interconnects the scan output terminal SOT and any one of the clock transfer lines when turned on.

Hereinafter, the operation of each stage with the above-stated configuration will be described.

First, a description will be given of an operation of the kth stage STk in a set period.

In the set period, the start pulse Vst or the (k−2)th carry pulse CPk−2 of a high state from the (k−2)th stage STk−2 is supplied to the first switching device Tr1 and fourth switching device Tr4 of the kth stage STk. Accordingly, the first switching device Tr1 is turned on, and the charging voltage VDD is supplied to the set node Q of the kth stage STk through the turned-on first switching device Tr1. As a result, the set node Q is charged, and the third switching device Tr3, carry pull-up switching device Uc and scan pull-up switching device Us, connected to the charged set node Q through the gate electrodes thereof, are all turned on. Also, the fourth switching device Tr4 is turned on by the (k−2)th carry pulse CPk−2.

On the other hand, the charging voltage VDD is supplied to the reset node QB through the seventh switching device Tr7 which is kept turned on by the charging voltage VDD. At this time, the discharging voltage VSS is also supplied to the reset node QB by the turned-on third and fourth switching devices Tr3 and Tr4. As a result, the reset node QB is kept discharged by the discharging voltage VSS supplied by the third and fourth switching devices Tr3 and Tr4. Accordingly, the sixth switching device Tr6, carry pull-down switching device Dc and scan pull-down switching device Ds, connected to the discharged reset node QB through the gate electrodes thereof, are all kept turned off.

Meanwhile, because there is no carry pulse from the (k+2)th stage STk+2 in this set period, the second switching device Tr2 of the kth stage STk remains turned off. Also, in this set period, the discharging switching device TrD also remains turned off. Further, since the reset signal Vreset assumes a low state in this set period, the fifth switching device Tr5 also remains turned off.

In this manner, in the set period, the set node Q of the kth stage STk is charged and the reset node QB thereof is discharged.

Next, a description will be given of an operation of the kth stage STk in an output period.

In the output period, a clock pulse is supplied to the respective drain electrodes of the carry pull-up switching device Uc, scan pull-up switching device Us and discharging switching device TrD of the kth stage STk. Then, the turned-on carry pull-up switching device Uc outputs the clock pulse as the kth carry pulse CPk and supplies this kth carry pulse CPk to the node controller NC of the (k+2)th stage STk+2 and the node controller NC of the (k−2)th stage STk−2 through the carry output terminal COT. The (k+2)th stage STk+2 is set by the kth carry pulse CPk, and the (k−2)th stage STk−2 is reset by the kth carry pulse CPk. Along with this, the turned-on scan pull-up switching device Us outputs the clock pulse as the kth scan pulse SPk and supplies this kth scan pulse SPk to the kth gate line, so as to drive the kth gate line.

On the other hand, the discharging switching device TrD is turned on by the kth scan pulse SPk supplied to the scan output terminal SOT, so as to supply the clock pulse to the scan output terminal SOT. Because the clock pulse assumes the high state in this output period, the kth scan pulse SPk of the high state is supplied to the scan output terminal SOT.

Meanwhile, the aforementioned clock pulse is any one of the first to fourth clock pulses CLK1 to CLK4, and a (4i+1)th stage (where i is a natural number including 0) is supplied with the first clock pulse CLK1, a (4i+2)th stage is supplied with the second clock pulse CLK2, a (4i+3)th stage is supplied with the third clock pulse CLK3, and a (4i+4)th stage is supplied with the fourth clock pulse CLK4.

In this manner, in the output period, the kth stage STk outputs the kth scan pulse SPk and the kth carry pulse CPk.

Next, a description will be given of an operation of the kth stage STk in a reset period.

In the reset period, a (k+2)th scan pulse SPk+2 and a (k+2)th carry pulse CPk+2 are outputted from the (k+2)th stage STk+2. The (k+2)th scan pulse SPk+2 is supplied to a (k+2)th gate line, and the (k+2)th carry pulse CPk+2 is supplied to the node controller NC of the kth stage STk and the node controller NC of the (k+4)th stage STk+4.

The carry pulse outputted from the (k+2)th stage STk+2 is supplied to the second switching device Tr2 of the kth stage STk, so as to turn on the second switching device Tr2. As a result, the discharging voltage VSS is supplied to the set node Q of the kth stage STk through the turned-on second switching device Tr2. Accordingly, the set node Q is discharged, and the third switching device Tr3, carry pull-up switching device Uc and scan pull-up switching device Us, connected to the discharged set node Q through the gate electrodes thereof, are all turned off. Meanwhile, because the (k−2)th carry pulse CPk−2 assumes the low state in this reset period, the fourth switching device Tr4 of the kth stage STk is also turned off. As the third and fourth switching devices Tr3 and Tr4 are both turned off in this manner, the charging voltage VDD is supplied to the reset node QB through the seventh switching device Tr7 which is kept turned on. As a result, the reset node QB is charged, and the sixth switching device Tr6, carry pull-down switching device Dc and scan pull-down switching device Ds, connected to the charged reset node QB through the gate electrodes thereof, are all turned on. The turned-on sixth switching device Tr6 supplies the discharging voltage VSS to the set node Q, so as to discharge the set node Q. The turned-on carry pull-down switching device Dc outputs the discharging voltage VSS and supplies it to the node controller NC of the (k+2)th stage STk+2 and the node controller NC of the (k−2)th stage STk−2 through the carry output terminal COT. The turned-on scan pull-down switching device Ds outputs the discharging voltage VSS and supplies it to the kth gate line through the scan output terminal SOT. Meanwhile, a spike voltage may be generated on this kth gate line. This spike voltage turns on the discharging switching device TrD. As the discharging switching device TrD is turned on, the kth gate line and the clock transfer line are connected with each other. Since the clock pulse of the low state has been applied to the clock transfer line, the level of the spike voltage on the kth gate line falls to the voltage level of the clock pulse of the low state. Therefore, the spike voltage generated subsequently to the normal output of the kth stage STk is stably discharged, thereby preventing one gate line from being driven more than once for one frame period.

In this manner, each of all the stages outputs one scan pulse for a display period corresponding to the one frame period. On the other hand, in a non-display period, the reset signal Vreset is outputted and supplied to the fifth switching devices Tr5 of all the stages. In the non-display period, the fifth switching devices Tr5 of all the stages are simultaneously turned on, so as to discharge the reset nodes QB of the corresponding stages. Also, in this non-display period, all signals supplied to each stage, namely, the charging voltage VDD, discharging voltage VSS and clock pulse fall to the same voltage level as that of the discharging voltage VSS.

Also, the output unit of each stage is divided into the carry pulse output unit CO and the scan pulse output unit SO whose outputs are independent of each other. For this reason, even if a spike voltage is generated on a gate line connected to the scan pulse output unit SO, this spike voltage has no effect on upstream and downstream stages. In other words, the set and reset operations of each stage are controlled by the carry pulse from the carry pulse output unit CO which operates separately from the scan pulse output unit SO.

As described above, in the present invention, the discharging switching device TrD is used to minimize generation of a spike voltage, and the stage output unit is divided into the carry pulse output unit CO and the scan pulse output unit SO which are driven separately from each other. Therefore, even if the spike voltage is generated, it can be prevented from influencing upstream and downstream stages.

This discharging switching device TrD is provided in each of the stages constituting the shift register, and the above-stated circuit configuration of each stage may be freely modified.

That is, each stage of FIG. 2 may have a configuration as follows.

Figure 6:
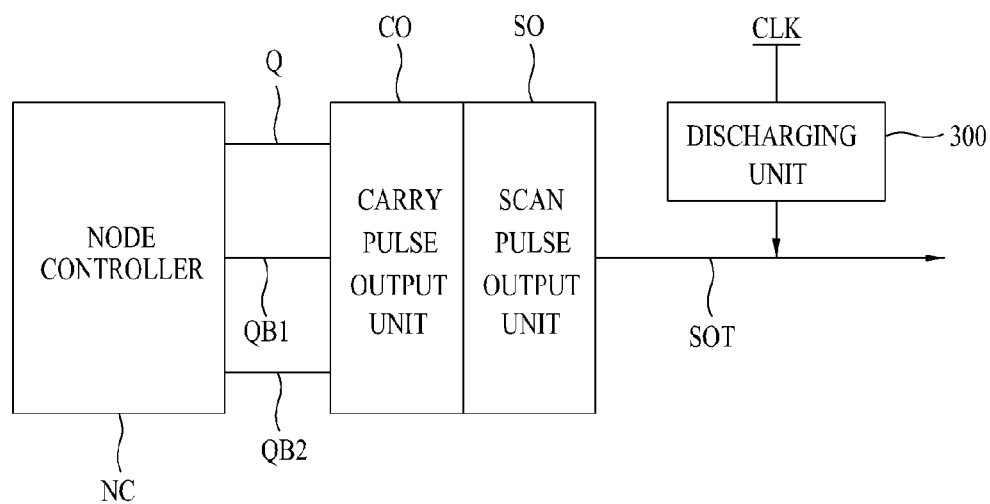
FIG. 6 is a block diagram showing a second embodiment of the configuration of any one of the stages of FIG. 2.

FIG. 6 is a block diagram showing a second embodiment of the configuration of any one of the stages of FIG. 2.

Each stage includes, as shown in FIG. 6, a scan pulse output unit SO controlled according to voltages at a set node Q, first reset node QB1 and second reset node QB2 for outputting a scan pulse and supplying it to a corresponding gate line through the scan output terminal SOT, a carry pulse output unit CO controlled according to the voltages at the set node Q, first reset node QB1 and second reset node QB2 for outputting a carry pulse and supplying it to an upstream stage and a downstream stage through the carry output terminal COT, a node controller NC for controlling the voltage states of the set node Q, first reset node QB1 and second reset node QB2 in response to a carry pulse from the upstream stage and a carry pulse from the downstream stage, and a discharging unit 300 connected to any one of a plurality of clock transfer lines which transfer a plurality of clock pulses with different phases, respectively, and the scan output terminal SOT for discharging a spike voltage of the scan output terminal SOT.

The stage of FIG. 6 has a circuit configuration as follows.

Figure 7:
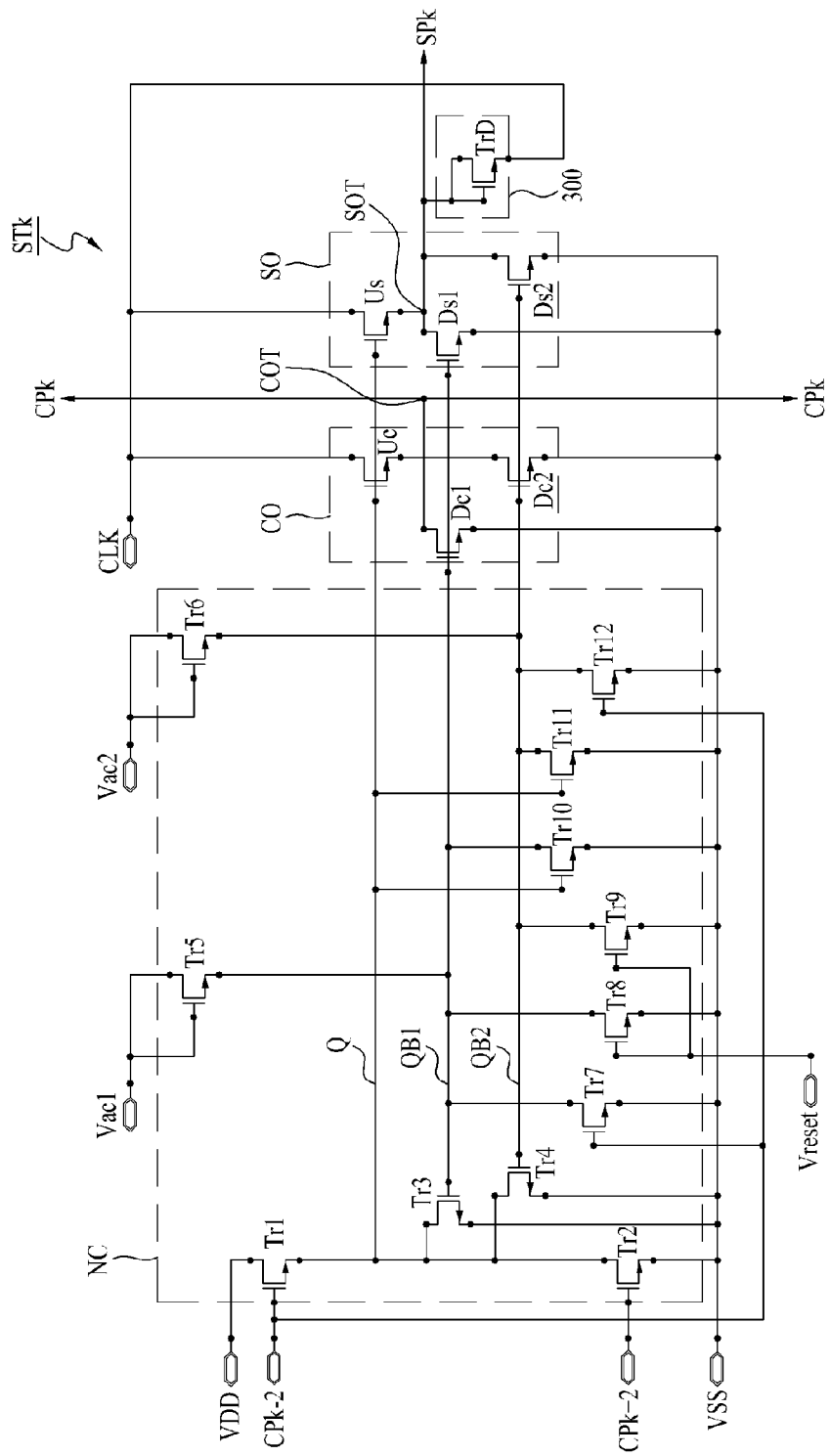
FIG. 7 is a detailed circuit diagram of a first embodiment of the circuit configuration of the stage shown in FIG. 6.
Figure 8:
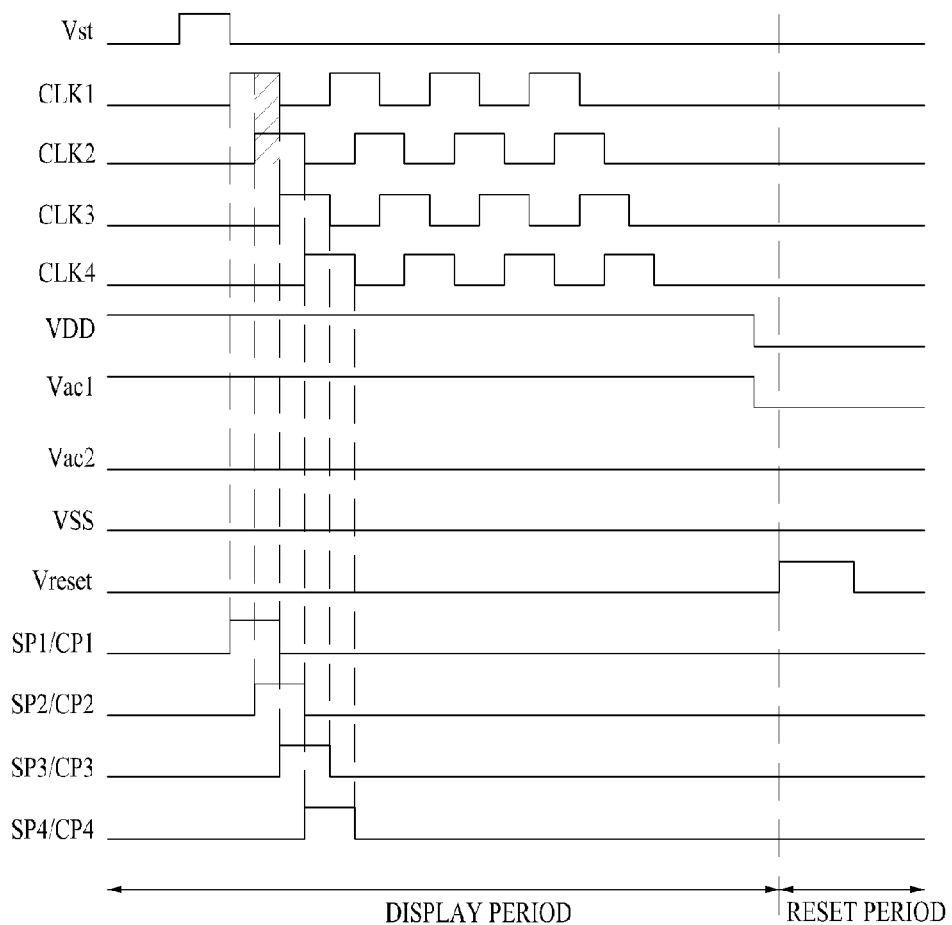
FIG. 8 is a timing diagram of various signals which are supplied to the stage of FIG. 7.

FIG. 7 is a detailed circuit diagram of a first embodiment of the circuit configuration of the stage shown in FIG. 6, and FIG. 8 is a timing diagram of various signals which are supplied to the stage of FIG. 7.

As shown in FIG. 8, the stage of FIG. 6 is further supplied with first and second alternating current (AC) voltages Vac1 and Vac2 in addition to the above-stated charging voltage VDD, discharging voltage VSS and clock pulse.

Both the first AC voltage Vac1 and second AC voltage Vac2 are AC voltages. The first AC voltage Vac1 is 180° phase-inverted with respect to the second AC voltage Vac2. The high state voltage values of the first and second AC voltages Vac1 and Vac2 may be the same as the voltage value of the charging voltage VDD, and the low state voltage values of the first and second AC voltages Vac1 and Vac2 may be the same as the voltage value of the discharging voltage VSS. The states of the first and second AC voltages Vac1 and Vac2 are inverted at intervals of a period of p frames. Here, p is a natural number. The aforementioned non-display period is present between adjacent frame periods.

A detailed description will hereinafter be given of the circuit configuration of each stage supplied with the aforementioned signals.

The node controller NC of the kth stage STk includes first to twelfth switching devices Tr1 to Tr12, as shown in FIG. 7.

The first switching device Tr1 is turned on or off in response to a carry pulse CPk−2 from the (k−2)th stage STk−2, and interconnects a charging voltage line which transfers the charging voltage VDD and the set node Q when turned on. Alternatively, the carry pulse CPk−2 from the (k−2)th stage STk−2 may be supplied to the drain electrode (or source electrode) of the first switching device Tr1 of the kth stage STk instead of the charging voltage VDD.

The second switching device Tr2 is turned on or off in response to a carry pulse CPk+2 from the (k+2)th stage STk+2, and interconnects a discharging voltage line which transfers the discharging voltage VSS and the set node Q when turned on.

The third switching device Tr3 is turned on or off in response to the voltage at the first reset node QB1, and interconnects the set node Q and the discharging voltage line when turned on.

The fourth switching device Tr4 is turned on or off in response to the voltage at the second reset node QB2, and interconnects the set node Q and the discharging voltage line when turned on.

The fifth switching device Tr5 is turned on or off in response to the first AC voltage from a first AC voltage line, and interconnects the first AC voltage line and the first reset node QB1 when turned on.

The sixth switching device Tr6 is turned on or off in response to the second AC voltage from a second AC voltage line, and interconnects the second AC voltage line and the second reset node QB2 when turned on.

The seventh switching device Tr7 is turned on or off in response to the carry pulse CPk−2 from the (k−2)th stage STk−2, and interconnects the first reset node QB1 and the discharging voltage line when turned on.

The eighth switching device Tr8 is turned on or off in response to a reset signal Vreset, and interconnects the first reset node QB1 and the discharging voltage line when turned on.

The ninth switching device Tr9 is turned on or off in response to the reset signal Vreset, and interconnects the second reset node QB2 and the discharging voltage line when turned on.

The tenth switching device Tr10 is turned on or off in response to the voltage at the set node Q, and interconnects the first reset node QB1 and the discharging voltage line when turned on.

The eleventh switching device Tr11 is turned on or off in response to the voltage at the set node Q, and interconnects the second reset node QB2 and the discharging voltage line when turned on.

The twelfth switching device Tr12 is turned on or off in response to the carry pulse CPk−2 from the (k−2)th stage STk−2, and interconnects the second reset node QB2 and the discharging voltage line when turned on.

The scan pulse output unit SO of the kth stage STk includes a scan pull-up switching device Us, a first scan pull-down switching device Ds1, and a second scan pull-down switching device Ds2.

The scan pull-up switching device Us is turned on or off in response to the voltage at the set node Q, and interconnects any one of the clock transfer lines and the scan output terminal SOT when turned on.

The first scan pull-down switching device Ds1 is turned on or off in response to the voltage at the first reset node QB1, and interconnects the scan output terminal SOT and the discharging voltage line when turned on.

The second scan pull-down switching device Ds2 is turned on or off in response to the voltage at the second reset node QB2, and interconnects the scan output terminal SOT and the discharging voltage line when turned on.

Alternatively, the stage of FIG. 6 may have a circuit configuration as follows.

Figure 9:
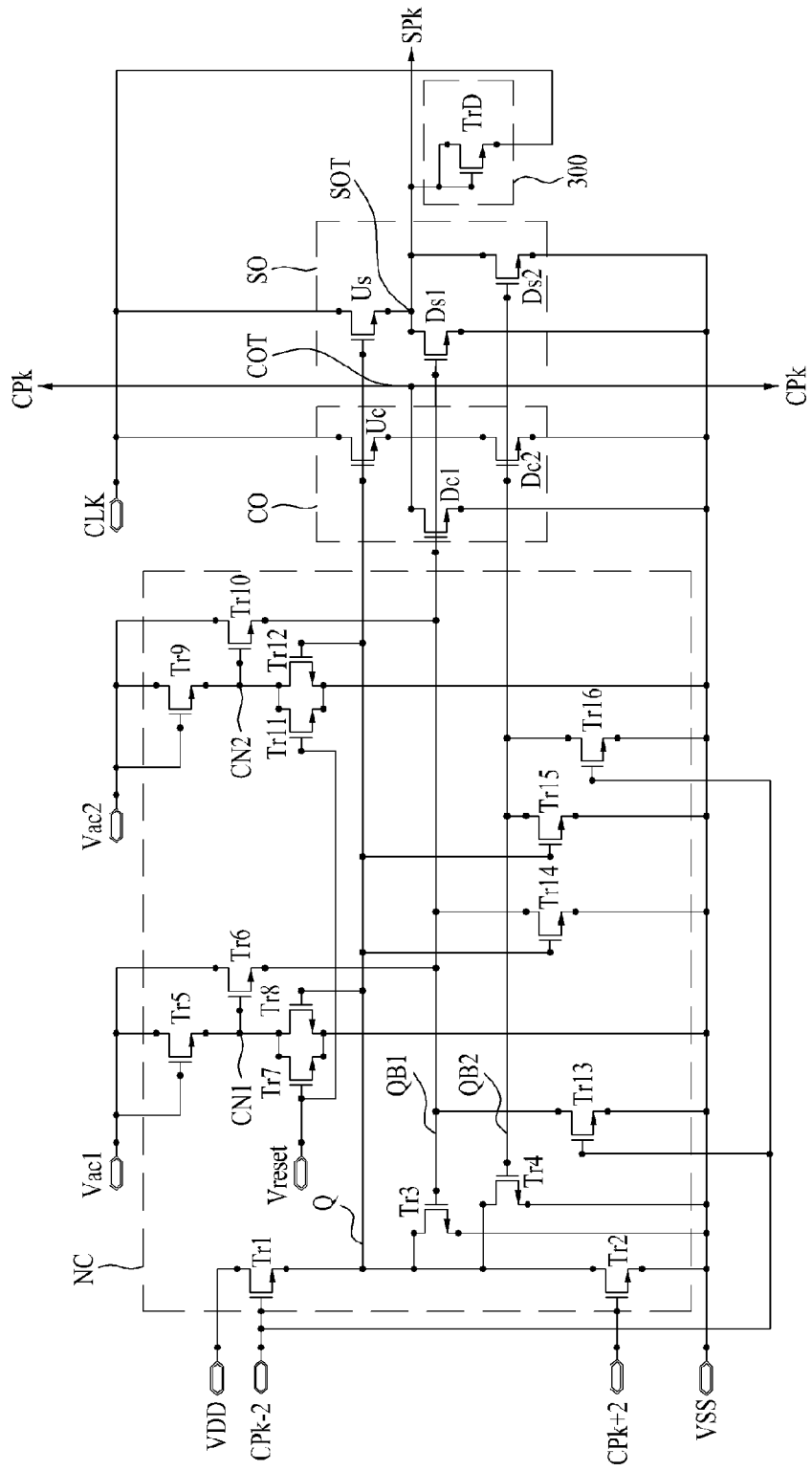
FIG. 9 is a detailed circuit diagram of a second embodiment of the circuit configuration of the stage shown in FIG. 6.

FIG. 9 is a detailed circuit diagram of a second embodiment of the circuit configuration of the stage shown in FIG. 6.

The node controller NC of the kth stage STk includes first to sixteenth switching devices Tr1 to Tr16, as shown in FIG. 9.

The first switching device Tr1 is turned on or off in response to a carry pulse CPk−2 from the (k−2)th stage STk−2, and interconnects a charging voltage line which transfers the charging voltage VDD and the set node Q when turned on. Alternatively, the carry pulse CPk−2 from the (k−2)th stage STk−2 may be supplied to the drain electrode (or source electrode) of the first switching device Tr1 of the kth stage STk instead of the charging voltage VDD.

The second switching device Tr2 is turned on or off in response to a carry pulse CPk+2 from the (k+2)th stage STk+2, and interconnects a discharging voltage line which transfers the discharging voltage VSS and the set node Q when turned on.

The third switching device Tr3 is turned on or off in response to the voltage at the first reset node QB1, and interconnects the set node Q and the discharging voltage line when turned on.

The fourth switching device Tr4 is turned on or off in response to the voltage at the second reset node QB2, and interconnects the set node Q and the discharging voltage line when turned on.

The fifth switching device Tr5 is turned on or off in response to the first AC voltage from a first AC voltage line, and interconnects the first AC voltage line and a first common node CN1 when turned on.

The sixth switching device Tr6 is turned on or off in response to a voltage at the first common node CN1, and interconnects the first AC voltage line and the first reset node QB1 when turned on.

The seventh switching device Tr7 is turned on or off in response to a reset signal Vreset, and interconnects the first common node CN1 and the discharging voltage line when turned on.

The eighth switching device Tr8 is turned on or off in response to the voltage at the set node Q, and interconnects the first common node CN1 and the discharging voltage line when turned on.

The ninth switching device Tr9 is turned on or off in response to the second AC voltage from a second AC voltage line, and interconnects the second AC voltage line and a second common node CN2 when turned on.

The tenth switching device Tr10 is turned on or off in response to a voltage at the second common node CN2, and interconnects the second AC voltage line and the first reset node QB1 when turned on.

The eleventh switching device Tr11 is turned on or off in response to the reset signal Vreset, and interconnects the second common node CN2 and the discharging voltage line when turned on.

The twelfth switching device Tr12 is turned on or off in response to the voltage at the set node Q, and interconnects the second common node CN2 and the discharging voltage line when turned on.

The thirteenth switching device Tr13 is turned on or off in response to the carry pulse CPk−2 from the (k−2)th stage STk−2, and interconnects the first reset node QB1 and the discharging voltage line when turned on.

The fourteenth switching device Tr14 is turned on or off in response to the voltage at the set node Q, and interconnects the first reset node QB1 and the discharging voltage line when turned on.

The fifteenth switching device Tr15 is turned on or off in response to the voltage at the set node Q, and interconnects the second reset node QB2 and the discharging voltage line when turned on.

The sixteenth switching device Tr16 is turned on or off in response to the carry pulse CPk−2 from the (k−2)th stage STk−2, and interconnects the second reset node QB2 and the discharging voltage line when turned on.

On the other hand, the aforementioned discharging switching device TrD may also be provided in a (2m−1)th stage (where m is a natural number) and a (2m)th stage which are adjacent to each other and whose nodes are connected to each other.

Figure 10:
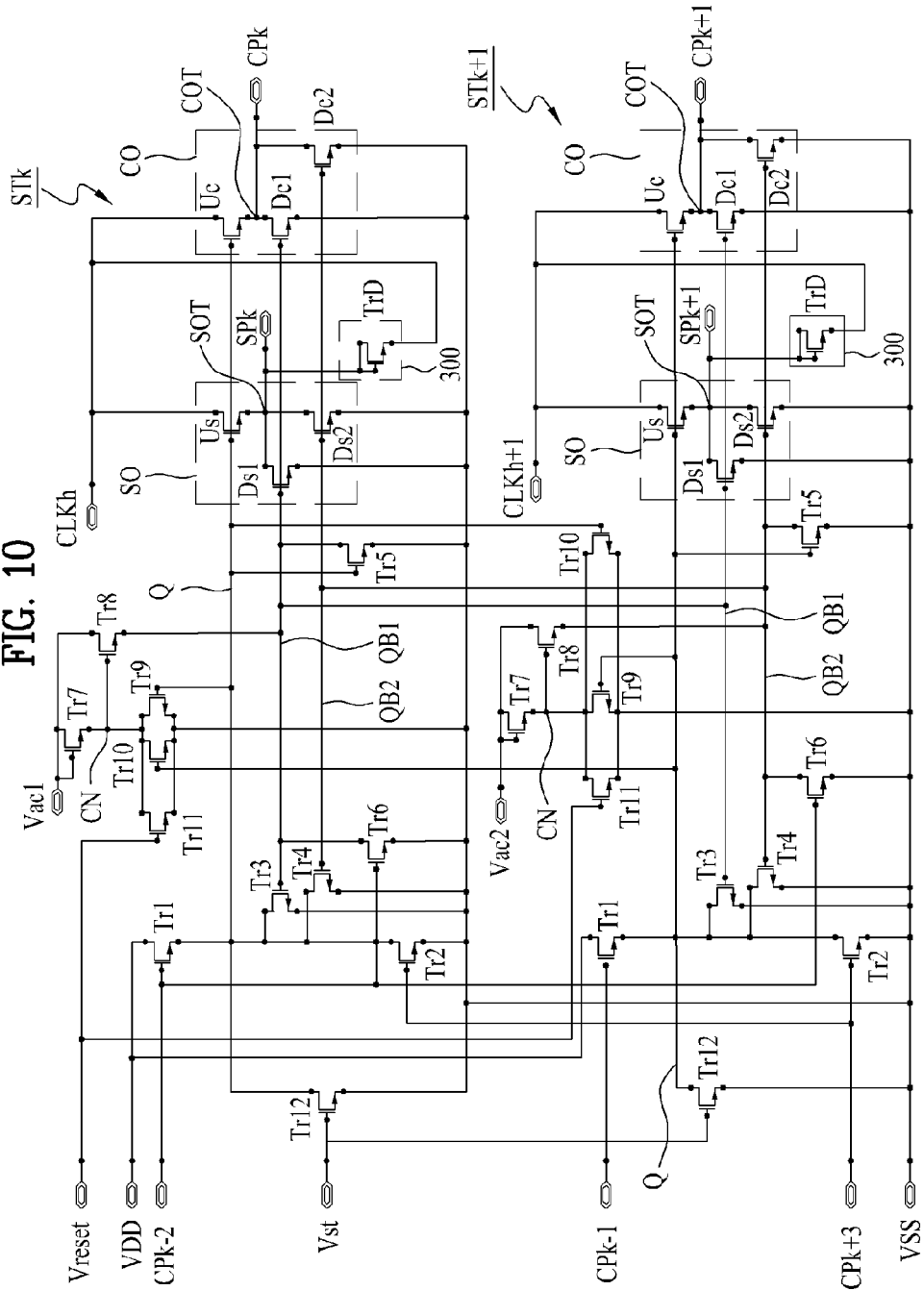
FIG. 10 is a circuit diagram showing a structure where nodes of two adjacent stages are connected to each other.

FIG. 10 is a circuit diagram showing a structure where nodes of two adjacent stages are connected to each other. The two adjacent stages are supplied with clock pulses with different phases. For example, as shown in FIG. 10, the kth stage is supplied with an hth clock pulse (where h is a natural number), and the (k+1)th stage is supplied with an (h+1)th clock pulse.

The node controller NC of the kth stage STk includes first to twelfth switching devices Tr1 to Tr12, as shown in FIG. 10.

The first switching device Tr1 is turned on or off in response to an external start pulse Vst or a carry pulse CPk−2 from the (k−2)th stage STk−2, and interconnects a charging voltage line which transfers the charging voltage VDD and the set node Q of the kth stage STk when turned on. Alternatively, the carry pulse CPk−2 from the (k−2)th stage STk−2 may be supplied to the drain electrode (or source electrode) of the first switching device Tr1 of the kth stage STk instead of the charging voltage VDD.

The second switching device Tr2 is turned on or off in response to a carry pulse CPk+3 from the (k+3)th stage STk+2, and interconnects a discharging voltage line which transfers the discharging voltage VSS and the set node Q of the kth stage STk when turned on.

The third switching device Tr3 is turned on or off in response to the voltage at the first reset nodes QB1 of the kth stage STk and (k+1)th stage STk+1 which are connected to each other, and interconnects the set node Q of the kth stage STk and the discharging voltage line when turned on.

The fourth switching device Tr4 is turned on or off in response to the voltage at the second reset nodes QB2 of the kth stage STk and (k+1)th stage STk+1 which are connected to each other, and interconnects the set node Q of the kth stage STk and the discharging voltage line when turned on.

The fifth switching device Tr5 is turned on or off in response to the voltage at the set node Q of the kth stage STk, and interconnects the first reset nodes QB1 of the kth stage STk and (k+1)th stage STk+1 and the discharging voltage line when turned on.

The sixth switching device Tr6 is turned on or off in response to the start pulse Vst or the carry pulse CPk−2 from the (k−2)th stage STk−2, and interconnects the first reset nodes QB1 of the kth stage STk and (k+1)th stage STk+1 and the discharging voltage line when turned on.

The seventh switching device Tr7 is turned on or off in response to the first AC voltage from a first AC voltage line, and interconnects the first AC voltage line and a common node CN of the kth stage STk when turned on.

The eighth switching device Tr8 is turned on or off in response to a voltage at the common node CN of the kth stage STk, and interconnects the first AC voltage line and the first reset nodes QB1 of the kth stage STk and (k+1)th stage STk+1 when turned on.

The ninth switching device Tr9 is turned on or off in response to the voltage at the set node Q of the kth stage STk, and interconnects the common node CN of the kth stage STk and the discharging voltage line when turned on.

The tenth switching device Tr10 is turned on or off in response to the voltage at the set node Q of the (k+1)th stage STk+1, and interconnects the common node CN of the kth stage STk and the discharging voltage line when turned on.

The eleventh switching device Tr11 is turned on or off in response to a reset signal Vreset, and interconnects the common node CN of the kth stage STk and the discharging voltage line when turned on.

The twelfth switching device Tr12 is turned on or off in response to the start pulse Vst, and interconnects the set node Q of the kth stage STk and the discharging voltage line when turned on.

The scan pulse output unit SO of the kth stage STk includes a scan pull-up switching device Us, a first scan pull-down switching device Ds1, and a second scan pull-down switching device Ds2.

The scan pull-up switching device Us is turned on or off in response to the voltage at the set node Q of the kth stage STk, and interconnects any one of the clock transfer lines and the scan output terminal SOT when turned on.

The first scan pull-down switching device Ds1 is turned on or off in response to the voltage at the first reset node QB1 of the kth stage STk, and interconnects the scan output terminal SOT and the discharging voltage line when turned on.

The second scan pull-down switching device Ds2 is turned on or off in response to the voltage at the second reset node QB2 of the kth stage STk, and interconnects the scan output terminal SOT and the discharging voltage line when turned on.

The carry pulse output unit CO of the kth stage STk includes a carry pull-up switching device Uc, a first carry pull-down switching device Dc1, and a second carry pull-down switching device Dc2.

The carry pull-up switching device Uc is turned on or off in response to the voltage at the set node Q of the kth stage STk, and interconnects any one of the clock transfer lines and the carry output terminal COT when turned on.

The first carry pull-down switching device Dc1 is turned on or off in response to the voltage at the first reset node QB1 of the kth stage STk, and interconnects the carry output terminal COT and the discharging voltage line when turned on.

The second carry pull-down switching device Dc2 is turned on or off in response to the voltage at the second reset node QB2 of the kth stage STk, and interconnects the carry output terminal COT and the discharging voltage line when turned on.

Here, the carry output terminal COT of the kth stage STk is connected to the node controller NC of the (k−2)th stage STk−2 and the node controller NC of the (k+2)th stage STk+2.

The node controller NC of the (k+1)th stage STk+1 includes first to twelfth switching devices Tr1 to Tr12.

The first switching device Tr1 is turned on or off in response to the external start pulse Vst or a carry pulse CPk−1 from the (k−1)th stage STk−1, and interconnects the charging voltage line which transfers the charging voltage VDD and the set node Q of the (k+1)th stage STk+1 when turned on.

The second switching device Tr2 is turned on or off in response to the carry pulse CPk+3 from the (k+3)th stage STk+2, and interconnects the set node Q of the (k+1)th stage STk+1 and the discharging voltage line when turned on.

The third switching device Tr3 is turned on or off in response to the voltage at the first reset nodes QB1 of the kth stage STk and (k+1)th stage STk+1 which are connected to each other, and interconnects the set node Q of the (k+1)th stage STk+1 and the discharging voltage line when turned on.

The fourth switching device Tr4 is turned on or off in response to the voltage at the second reset nodes QB2 of the kth stage STk and (k+1)th stage STk+1 which are connected to each other, and interconnects the set node Q of the (k+1)th stage STk+1 and the discharging voltage line when turned on.

The fifth switching device Tr5 is turned on or off in response to the voltage at the set node Q of the (k+1)th stage STk+1, and interconnects the second reset nodes QB2 of the kth stage STk and (k+1)th stage STk+1 and the discharging voltage line when turned on.

The sixth switching device Tr6 is turned on or off in response to the start pulse Vst or the carry pulse CPk−2 from the (k−2)th stage STk−2, and interconnects the second reset nodes QB2 of the kth stage STk and (k+1)th stage STk+1 and the discharging voltage line when turned on.

The seventh switching device Tr7 is turned on or off in response to the second AC voltage from a second AC voltage line, and interconnects the second AC voltage line and a common node CN of the (k+1)th stage STk+1 when turned on.

The eighth switching device Tr8 is turned on or off in response to a voltage at the common node CN of the (k+1)th stage STk+1, and interconnects the second AC voltage line and the second reset nodes QB2 of the kth stage STk and (k+1)th stage STk+1 when turned on.

The ninth switching device Tr9 is turned on or off in response to the voltage at the set node Q of the (k+1)th stage STk+1, and interconnects the common node CN of the (k+1)th stage STk+1 and the discharging voltage line when turned on.

The tenth switching device Tr10 is turned on or off in response to the voltage at the set node Q of the kth stage STk, and interconnects the common node CN of the (k+1)th stage STk+1 and the discharging voltage line when turned on.

The eleventh switching device Tr11 is turned on or off in response to the reset signal Vreset, and interconnects the common node CN of the (k+1)th stage STk+1 and the discharging voltage line when turned on.

The twelfth switching device Tr12 is turned on or off in response to the start pulse Vst, and interconnects the set node Q of the (k+1)th stage STk+1 and the discharging voltage line when turned on.

The scan pulse output unit SO of the (k+1)th stage STk+1 includes a scan pull-up switching device Us, a first scan pull-down switching device Ds1, and a second scan pull-down switching device Ds2.

The scan pull-up switching device Us is turned on or off in response to the voltage at the set node Q of the (k+1)th stage STk+1, and interconnects any one of the clock transfer lines and the scan output terminal SOT when turned on.

The first scan pull-down switching device Ds1 is turned on or off in response to the voltage at the first reset node QB1 of the (k+1)th stage STk+1, and interconnects the scan output terminal SOT and the discharging voltage line when turned on.

The second scan pull-down switching device Ds2 is turned on or off in response to the voltage at the second reset node QB2 of the (k+1)th stage STk+1, and interconnects the scan output terminal SOT and the discharging voltage line when turned on.

The carry pulse output unit CO of the (k+1)th stage STk+1 includes a carry pull-up switching device Uc, a first carry pull-down switching device Dc1, and a second carry pull-down switching device Dc2.

The carry pull-up switching device Uc is turned on or off in response to the voltage at the set node Q of the (k+1)th stage STk+1, and interconnects any one of the clock transfer lines and the carry output terminal COT when turned on.

The first carry pull-down switching device Dc1 is turned on or off in response to the voltage at the first reset node QB1 of the (k+1)th stage STk+1, and interconnects the carry output terminal COT and the discharging voltage line when turned on.

The second carry pull-down switching device Dc2 is turned on or off in response to the voltage at the second reset node QB2 of the (k+1)th stage STk+1, and interconnects the carry output terminal COT and the discharging voltage line when turned on.

Here, the carry output terminal COT of the (k+1)th stage STk+1 is connected to the node controller NC of the (k−1)th stage STk−1 and the node controller NC of the (k+3)th stage STk+3.

Figure 11:
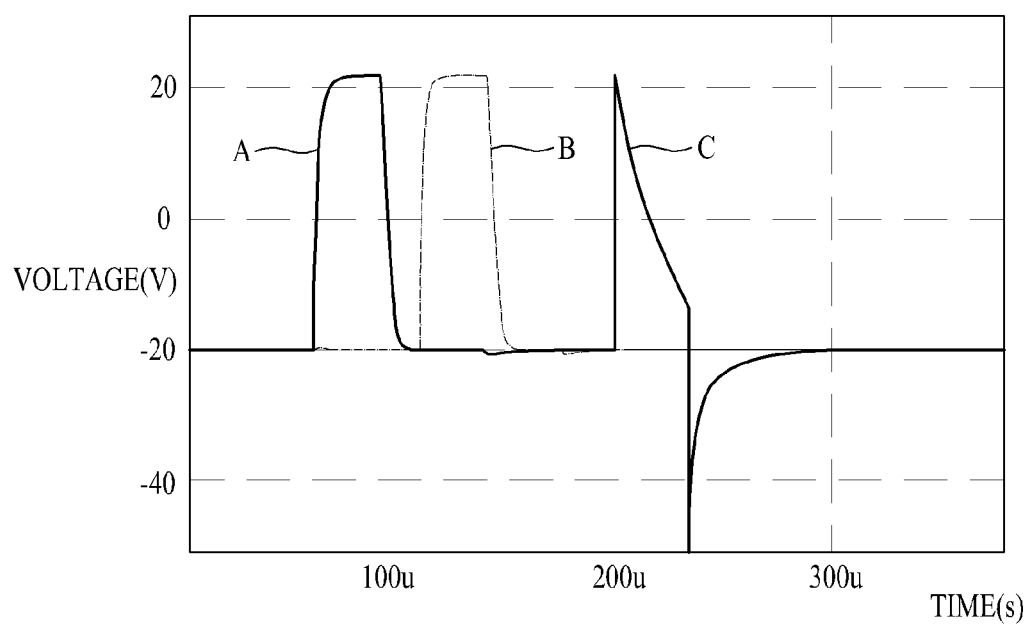
FIG. 11 and FIG. 12 are waveform diagrams illustrating effects of a shift register according to the present invention.
Figure 12:
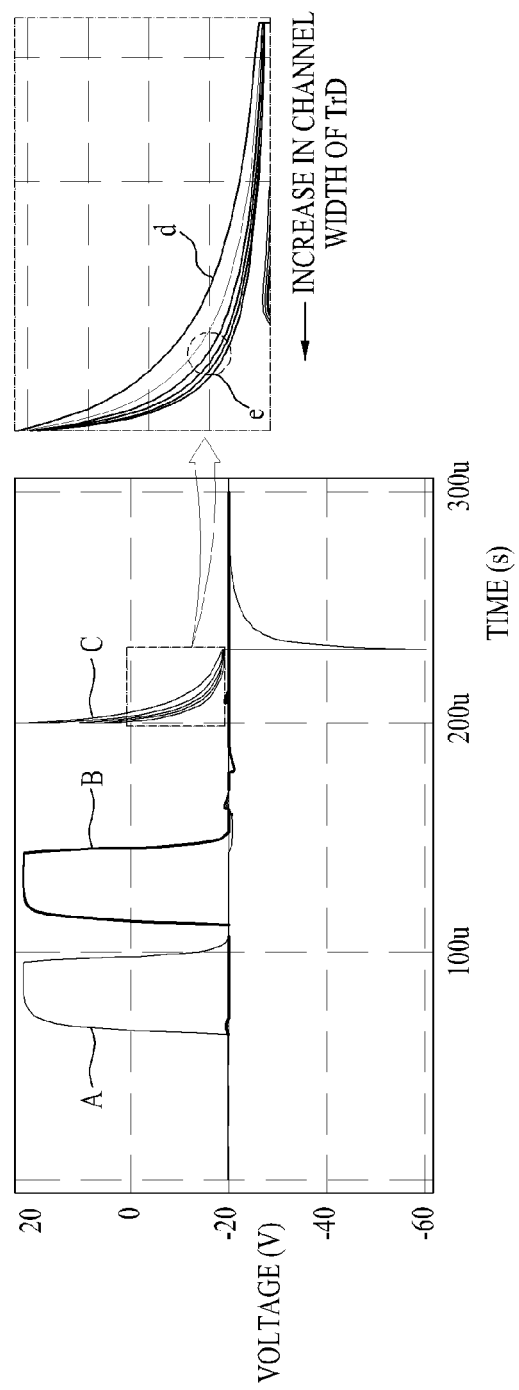

FIG. 11 and FIG. 12 are waveform diagrams illustrating effects of a shift register according to the present invention, in which "A" represents the waveform of a (k−2)th scan pulse SPk−2 outputted from a (k−2)th stage STk−2 and supplied to a (k−2)th gate line, "B" represents the waveform of a kth scan pulse SPk outputted from a kth stage STk and supplied to a kth gate line, and "C" represents the waveform of a spike voltage generated on the (k−2)th gate line. From these drawings, it can be seen that the spike voltage is rapidly discharged by a discharging switching device TrD and, thus, no multi-output is generated.

As can be seen from FIG. 12, when the channel width of the discharging switching device TrD increases, the spike voltage falls to a low voltage at higher speed. That is, a curve d represents the waveform of a spike voltage when a conventional shift register having no discharging switching device TrD is used, and a curve group e represents the waveform of a spike voltage when the shift register of the present invention having the discharging switching device TrD is used. Here, the curve group e shows shorter falling times than the curve d. On the other hand, respective curves in the curve group e represent different falling times depending on different channel widths of the discharging switching device TrD. When the discharging switching device TrD has a larger channel width, the falling time is shorter.

As apparent from the above description, a shift register according to the present invention has effects as follows.

In the present invention, a discharging switching device is used to minimize generation of a spike voltage, and an output unit of each stage is divided into a carry pulse output unit and a scan pulse output unit which are driven separately from each other. Therefore, even if the spike voltage is generated, it can be prevented from influencing upstream and downstream stages.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising a plurality of stages for sequentially driving gate lines to which pixels for display of an image are connected, wherein each of the stages comprises:
   a plurality of nodes;
   a scan pulse output unit controlled according to voltages at the nodes for outputting a scan pulse and supplying the scan pulse to a corresponding one of the gate lines through a scan output terminal;
   a carry pulse output unit controlled according to the voltages at the nodes for outputting a carry pulse and supplying the carry pulse to an upstream one of the stages and a downstream one of the stages through a carry output terminal;
   a node controller for controlling voltage states of the nodes in response to a carry pulse from the upstream stage and a carry pulse from the downstream stage; and
   a discharging unit connected to any one of a plurality of clock transfer lines and the scan output terminal for discharging a spike voltage of the scan output terminal, the clock transfer lines transferring a plurality of clock pulses with different phases, respectively;
   wherein the discharging unit comprises a discharging switching device turned on or off in response to the spike voltage of the scan output terminal, the discharging switching device interconnecting the scan output terminal and any one of the clock transfer lines when turned on.

2. The shift register according to claim 1, wherein:
   the nodes comprise a set node and a reset node; and
   the node controller of a kth one of the stages comprises:
   a first switching device turned on or off in response to a carry pulse from a (k−2)th one of the stages, the first switching device interconnecting a charging voltage line and the set node when turned on, the charging voltage line transferring a charging voltage;
   a second switching device turned on or off in response to a carry pulse from a (k+2)th one of the stages, the second switching device interconnecting a discharging voltage line and the set node when turned on, the discharging voltage line transferring a discharging voltage;
   a third switching device turned on or off in response to a voltage at the set node, the third switching device interconnecting the reset node and the discharging voltage line when turned on;
   a fourth switching device turned on or off in response to the carry pulse from the (k−2)th stage, the fourth switching device interconnecting the reset node and the discharging voltage line when turned on;

a fifth switching device turned on or off in response to a reset signal, the fifth switching device interconnecting the reset node and the discharging voltage line when turned on;

a sixth switching device turned on or off in response to a voltage at the reset node, the sixth switching device interconnecting the set node and the discharging voltage line when turned on; and a seventh switching device turned on or off in response to the charging voltage, the seventh switching device interconnecting the charging voltage line and the reset node when turned on.

3. The shift register according to claim 2, wherein:

the scan pulse output unit of the kth stage comprises:

a scan pull-up switching device turned on or off in response to the voltage at the set node, the scan pull-up switching device interconnecting any one of the clock transfer lines and the scan output terminal when turned on; and a scan pull-down switching device turned on or off in response to the voltage at the reset node, the scan pull-down switching device interconnecting the scan output terminal and the discharging voltage line when turned on; and the carry pulse output unit of the kth stage comprises:

a carry pull-up switching device turned on or off in response to the voltage at the set node, the carry pull-up switching device interconnecting any one of the clock transfer lines and the carry output terminal when turned on; and a carry pull-down switching device turned on or off in response to the voltage at the reset node, the carry pull-down switching device interconnecting the carry output terminal and the discharging voltage line when turned on, wherein the carry output terminal of the kth stage is connected to the node controller of the (k−2)th stage and the node controller of the (k+2)th stage.

4. The shift register according to claim 1, wherein:

the nodes comprise a set node, a first reset node, and a second reset node; and the node controller of a kth one of the stages comprises:

a first switching device turned on or off in response to a carry pulse from a (k−2)th one of the stages, the first switching device interconnecting a charging voltage line and the set node when turned on, the charging voltage line transferring a charging voltage;

a second switching device turned on or off in response to a carry pulse from a (k+2)th one of the stages, the second switching device interconnecting a discharging voltage line and the set node when turned on, the discharging voltage line transferring a discharging voltage;

a third switching device turned on or off in response to a voltage at the first reset node, the third switching device interconnecting the set node and the discharging voltage line when turned on;

a fourth switching device turned on or off in response to a voltage at the second reset node, the fourth switching device interconnecting the set node and the discharging voltage line when turned on;

a fifth switching device turned on or off in response to a first alternating current (AC) voltage from a first AC voltage line, the fifth switching device interconnecting the first AC voltage line and the first reset node when turned on;

a sixth switching device turned on or off in response to a second AC voltage from a second AC voltage line, the sixth switching device interconnecting the second AC voltage line and the second reset node when turned on;

a seventh switching device turned on or off in response to the carry pulse from the (k−2)th stage, the seventh switching device interconnecting the first reset node and the discharging voltage line when turned on;

an eighth switching device turned on or off in response to a reset signal, the eighth switching device interconnecting the first reset node and the discharging voltage line when turned on;

a ninth switching device turned on or off in response to the reset signal, the ninth switching device interconnecting the second reset node and the discharging voltage line when turned on;

a tenth switching device turned on or off in response to a voltage at the set node, the tenth switching device interconnecting the first reset node and the discharging voltage line when turned on;

an eleventh switching device turned on or off in response to the voltage at the set node, the eleventh switching device interconnecting the second reset node and the discharging voltage line when turned on; and a twelfth switching device turned on or off in response to the carry pulse from the (k−2)th stage, the twelfth switching device interconnecting the second reset node and the discharging voltage line when turned on.

5. The shift register according to claim 4, wherein:

the scan pulse output unit of the kth stage comprises:

a scan pull-up switching device turned on or off in response to the voltage at the set node, the scan pull-up switching device interconnecting any one of the clock transfer lines and the scan output terminal when turned on;

a first scan pull-down switching device turned on or off in response to the voltage at the first reset node, the first scan pull-down switching device interconnecting the scan output terminal and the discharging voltage line when turned on; and a second scan pull-down switching device turned on or off in response to the voltage at the second reset node, the second scan pull-down switching device interconnecting the scan output terminal and the discharging voltage line when turned on; and the carry pulse output unit of the kth stage comprises:

a carry pull-up switching device turned on or off in response to the voltage at the set node, the carry pull-up switching device interconnecting any one of the clock transfer lines and the carry output terminal when turned on;

a first carry pull-down switching device turned on or off in response to the voltage at the first reset node, the first carry pull-down switching device interconnecting the carry output terminal and the discharging voltage line when turned on; and a second carry pull-down switching device turned on or off in response to the voltage at the second reset node, the second carry pull-down switching device interconnecting the carry output terminal and the discharging voltage line when turned on, wherein the carry output terminal of the kth stage is connected to the node controller of the (k−2)th stage and the node controller of the (k+2)th stage.

6. The shift register according to claim 1, wherein:

the nodes comprise a set node, a first reset node, and a second reset node; a the node controller of a kth one of the stages comprises:

a first switching device turned on or off in response to a carry pulse from a (k−2)th one of the stages, the first switching device interconnecting a charging voltage line and the set node when turned on, the charging voltage line transferring a charging voltage;

a second switching device turned on or off in response to a carry pulse from a (k+2)th one of the stages, the second switching device interconnecting a discharging voltage line and the set node when turned on, the discharging voltage line transferring a discharging voltage;

a third switching device turned on or off in response to a voltage at the first reset node, the third switching device interconnecting the set node and the discharging voltage line when turned on;

a fourth switching device turned on or off in response to a voltage at the second reset node, the fourth switching device interconnecting the set node and the discharging voltage line when turned on;

a fifth switching device turned on or off in response to a first AC voltage from a first AC voltage line, the fifth switching device interconnecting the first AC voltage line and a first common node when turned on;

a sixth switching device turned on or off in response to a voltage at the first common node, the sixth switching device interconnecting the first AC voltage line and the first reset node when turned on;

a seventh switching device turned on or off in response to a reset signal, the seventh switching device interconnecting the first common node and the discharging voltage line when turned on;

an eighth switching device turned on or off in response to a voltage at the set node, the eighth switching device interconnecting the first common node and the discharging voltage line when turned on;

a ninth switching device turned on or off in response to a second AC voltage from a second AC voltage line, the ninth switching device interconnecting the second AC voltage line and a second common node when turned on;

a tenth switching device turned on or off in response to a voltage at the second common node, the tenth switching device interconnecting the second AC voltage line and the first reset node when turned on;

an eleventh switching device turned on or off in response to the reset signal, the eleventh switching device interconnecting the second common node and the discharging voltage line when turned on;

a twelfth switching device turned on or off in response to the voltage at the set node, the twelfth switching device interconnecting the second common node and the discharging voltage line when turned on;

a thirteenth switching device turned on or off in response to the carry pulse from the (k−2)th stage, the thirteenth switching device interconnecting the first reset node and the discharging voltage line when turned on;

a fourteenth switching device turned on or off in response to the voltage at the set node, the fourteenth switching device interconnecting the first reset node and the discharging voltage line when turned on;

a fifteenth switching device turned on or off in response to the voltage at the set node, the fifteenth switching device interconnecting the second reset node and the discharging voltage line when turned on; and a sixteenth switching device turned on or off in response to the carry pulse from the (k−2)th stage, the sixteenth switching device interconnecting the second reset node and the discharging voltage line when turned on.

7. The shift register according to claim 6, wherein:
the scan pulse output unit of the kth stage comprises:
a scan pull-up switching device turned on or off in response to the voltage at the set node, the scan pull-up switching device interconnecting any one of the clock transfer lines and the scan output terminal when turned on;

a first scan pull-down switching device turned on or off in response to the voltage at the first reset node, the first scan pull-down switching device interconnecting the scan output terminal and the discharging voltage line when turned on; and a second scan pull-down switching device turned on or off in response to the voltage at the second reset node, the second scan pull-down switching device interconnecting the scan output terminal and the discharging voltage line when turned on; and the carry pulse output unit of the kth stage comprises:
a carry pull-up switching device turned on or off in response to the voltage at the set node, the carry pull-up switching device interconnecting any one of the clock transfer lines and the carry output terminal when turned on;

a first carry pull-down switching device turned on or off in response to the voltage at the first reset node, the first carry pull-down switching device interconnecting the carry output terminal and the discharging voltage line when turned on; and a second carry pull-down switching device turned on or off in response to the voltage at the second reset node, the second carry pull-down switching device interconnecting the carry output terminal and the discharging voltage line when turned on, wherein the carry output terminal of the kth stage is connected to the node controller of the (k−2)th stage and the node controller of the (k+2)th stage.

8. The shift register according to claim 1, wherein:
the nodes comprise a set node, a first reset node, and a second reset node; and the node controller of a kth one of the stages comprises:
a first switching device turned on or off in response to an external start pulse or a carry pulse from a (k−2)th one of the stages, the first switching device interconnecting a charging voltage line and the set node of the kth stage when turned on, the charging voltage line transferring a charging voltage;

a second switching device turned on or off in response to a carry pulse from a (k+3)th one of the stages, the second switching device interconnecting a discharging voltage line and the set node of the kth stage when turned on, the discharging voltage line transferring the discharging voltage;

a third switching device turned on or off in response to a voltage at the first reset nodes of the kth stage and a (k+1)th one of the stages which are connected to each other, the third switching device interconnecting the set node of the kth stage and the discharging voltage line when turned on;

a fourth switching device turned on or off in response to a voltage at the second reset nodes of the kth stage and (k+1)th stage which are connected to each other, the fourth switching device interconnecting the set node of the kth stage and the discharging voltage line when turned on;

a fifth switching device turned on or off in response to a voltage at the set node of the kth stage, the fifth switching device interconnecting the first reset nodes of the kth stage and (k+1)th stage and the discharging voltage line when turned on;

a sixth switching device turned on or off in response to the start pulse or the carry pulse from the (k−2)th stage, the sixth switching device interconnecting the first reset nodes of the kth stage and (k+1)th stage and the discharging voltage line when turned on;
a seventh switching device turned on or off in response to a first AC voltage from a first AC voltage line, the seventh switching device interconnecting the first AC voltage line and a common node of the kth stage when turned on;
an eighth switching device turned on or off in response to a voltage at the common node of the kth stage, the eighth switching device interconnecting the first AC voltage line and the first reset nodes of the kth stage and (k+1)th stage when turned on;
a ninth switching device turned on or off in response to the voltage at the set node of the kth stage, the ninth switching device interconnecting the common node of the kth stage and the discharging voltage line when turned on;
a tenth switching device turned on or off in response to a voltage at the set node of the (k+1)th stage, the tenth switching device interconnecting the common node of the kth stage and the discharging voltage line when turned on;
an eleventh switching device turned on or off in response to a reset signal, the eleventh switching device interconnecting the common node of the kth stage and the discharging voltage line when turned on; and
a twelfth switching device turned on or off in response to the start pulse, the twelfth switching device interconnecting the set node of the kth stage and the discharging voltage line when turned on.

9. The shift register according to claim 8, wherein:
the scan pulse output unit of the kth stage comprises:
a scan pull-up switching device turned on or off in response to the voltage at the set node of the kth stage, the scan pull-up switching device interconnecting any one of the clock transfer lines and the scan output terminal when turned on;
a first scan pull-down switching device turned on or off in response to the voltage at the first reset node of the kth stage, the first scan pull-down switching device interconnecting the scan output terminal and the discharging voltage line when turned on; and
a second scan pull-down switching device turned on or off in response to the voltage at the second reset node of the kth stage, the second scan pull-down switching device interconnecting the scan output terminal and the discharging voltage line when turned on; and
the carry pulse output unit of the kth stage comprises:
a carry pull-up switching device turned on or off in response to the voltage at the set node of the kth stage, the carry pull-up switching device interconnecting any one of the clock transfer lines and the carry output terminal when turned on;
a first carry pull-down switching device turned on or off in response to the voltage at the first reset node of the kth stage, the first carry pull-down switching device interconnecting the carry output terminal and the discharging voltage line when turned on; and
a second carry pull-down switching device turned on or off in response to the voltage at the second reset node of the kth stage, the second carry pull-down switching device interconnecting the carry output terminal and the discharging voltage line when turned on,
wherein the carry output terminal of the kth stage is connected to the node controller of the (k−2)th stage and the node controller of the (k+2)th stage.

10. The shift register according to claim 9, wherein the node controller of the (k+1)th stage comprises:
a first switching device turned on or off in response to the external start pulse or a carry pulse from a (k−1)th one of the stages, the first switching device interconnecting the charging voltage line and the set node of the (k+1)th stage when turned on;
a second switching device turned on or off in response to the carry pulse from the (k+3)th stage, the second switching device interconnecting the set node of the (k+1)th stage and the discharging voltage line when turned on;
a third switching device turned on or off in response to the voltage at the first reset nodes of the kth stage and (k+1)th stage which are connected to each other, the third switching device interconnecting the set node of the (k+1)th stage and the discharging voltage line when turned on;
a fourth switching device turned on or off in response to the voltage at the second reset nodes of the kth stage and (k+1)th stage which are connected to each other, the fourth switching device interconnecting the set node of the (k+1)th stage and the discharging voltage line when turned on;
a fifth switching device turned on or off in response to the voltage at the set node of the (k+1)th stage, the fifth switching device interconnecting the second reset nodes of the kth stage and (k+1)th stage and the discharging voltage line when turned on;
a sixth switching device turned on or off in response to the start pulse or the carry pulse from the (k−2)th stage, the sixth switching device interconnecting the second reset nodes of the kth stage and (k+1)th stage and the discharging voltage line when turned on;
a seventh switching device turned on or off in response to a second AC voltage from a second AC voltage line, the seventh switching device interconnecting the second AC voltage line and a common node of the (k+1)th stage when turned on;
an eighth switching device turned on or off in response to a voltage at the common node of the (k+1)th stage, the eighth switching device interconnecting the second AC voltage line and the second reset nodes of the kth stage and (k+1)th stage when turned on;
a ninth switching device turned on or off in response to the voltage at the set node of the (k+1)th stage, the ninth switching device interconnecting the common node of the (k+1)th stage and the discharging voltage line when turned on;
a tenth switching device turned on or off in response to the voltage at the set node of the kth stage, the tenth switching device interconnecting the common node of the (k+1)th stage and the discharging voltage line when turned on;
an eleventh switching device turned on or off in response to the reset signal, the eleventh switching device interconnecting the common node of the (k+1)th stage and the discharging voltage line when turned on; and
a twelfth switching device turned on or off in response to the start pulse, the twelfth switching device interconnecting the set node of the (k+1)th stage and the discharging voltage line when turned on.

11. The shift register according to claim 10, wherein:
the scan pulse output unit of the (k+1)th stage comprises:
a scan pull-up switching device turned on or off in response to the voltage at the set node of the (k+1)th stage, the scan pull-up switching device interconnecting any one of the clock transfer lines and the scan output terminal when turned on;

a first scan pull-down switching device turned on or off in response to the voltage at the first reset node of the (k+1)th stage, the first scan pull-down switching device interconnecting the scan output terminal and the discharging voltage line when turned on; and a second scan pull-down switching device turned on or off in response to the voltage at the second reset node of the (k+1)th stage, the second scan pull-down switching device interconnecting the scan output terminal and the discharging voltage line when turned on; and the carry pulse output unit of the (k+1)th stage comprises:

a carry pull-up switching device turned on or off in response to the voltage at the set node of the (k+1)th stage, the carry pull-up switching device interconnecting any one of the clock transfer lines and the carry output terminal when turned on;

a first carry pull-down switching device turned on or off in response to the voltage at the first reset node of the (k+1)th stage, the first carry pull-down switching device interconnecting the carry output terminal and the discharging voltage line when turned on; and a second carry pull-down switching device turned on or off in response to the voltage at the second reset node of the (k+1)th stage, the second carry pull-down switching device interconnecting the carry output terminal and the discharging voltage line when turned on, wherein the carry output terminal of the (k+1)th stage is connected to the node controller of the (k−1)th stage and the node controller of the (k+3)th stage.

* * * * *